(12) United States Patent
Mills et al.

(10) Patent No.: US 8,807,128 B2
(45) Date of Patent: Aug. 19, 2014

(54) LINEAR FRESNEL SOLAR ARRAYS

(75) Inventors: David R. Mills, Roseville (AU); Philipp Schramek, Starnberg (DE); Peter K. Le Lievre, Palo Alto, CA (US); David B. Degraaff, Mountain View, CA (US); Peter L. Johnson, Mountain View, CA (US); Alexander Hoermann, Menlo Park, CA (US)

(73) Assignee: Areva Solar, Inc., Mountain View, CA (US)

( * ) Notice: Subject to any disclaimer, the term of this patent is extended or adjusted under 35 U.S.C. 154(b) by 1162 days.

(21) Appl. No.: 12/675,753

(22) PCT Filed: Aug. 27, 2008

(86) PCT No.: PCT/US2008/010230
§ 371 (c)(1),
(2), (4) Date: Aug. 4, 2010

(87) PCT Pub. No.: WO2009/029277
PCT Pub. Date: Mar. 5, 2009

(65) Prior Publication Data
US 2011/0005513 A1    Jan. 13, 2011

Related U.S. Application Data

(63) Continuation of application No. 12/012,920, filed on Feb. 5, 2008, and a continuation of application No. 12/012,829, filed on Feb. 5, 2008, and a continuation of application No. 12/012,821, filed on Feb. 5, 2008.

(60) Provisional application No. 61/007,926, filed on Aug. 27, 2007.

(51) Int. Cl.
*F24J 2/38* (2014.01)

(52) U.S. Cl.
USPC ............ 126/569; 126/600; 126/607; 126/605

(58) Field of Classification Search
USPC ......... 126/600, 569, 273, 571, 572, 605, 607, 126/608
See application file for complete search history.

(56) References Cited

U.S. PATENT DOCUMENTS

| | | |
|---|---|---|
| 514,338 A | 2/1894 | Row |
| 787,145 A | 4/1905 | Brown |

(Continued)

FOREIGN PATENT DOCUMENTS

| | | |
|---|---|---|
| BE | 1013565 A3 | 4/2002 |
| DE | 2802859 A1 | 7/1979 |

(Continued)

OTHER PUBLICATIONS

Final Office Action received for U.S. Appl. No. 12/012,920, mailed on Jan. 27, 2014, 14 pages.

(Continued)

*Primary Examiner* — John K Fristoe, Jr.
*Assistant Examiner* — Umashankar Venkatesan
(74) *Attorney, Agent, or Firm* — Morrison & Foerster LLP

(57) ABSTRACT

Disclosed herein are examples and variations of solar energy collector system comprising an elevated linear receiver (5) and first and second reflector fields (10P, 10E) located on opposite sides of, and arranged and driven to reflect solar radiation to, the receiver (5). Also disclosed herein are examples and variations of receivers (5) and reflectors (12a) that may, in some variations, be utilized in the disclosed solar energy collector systems.

8 Claims, 15 Drawing Sheets

(56) References Cited

U.S. PATENT DOCUMENTS

| | | |
|---|---|---|
| 1,174,602 A | 3/1916 | Naylon |
| 1,240,890 A | 9/1917 | Shuman |
| 1,852,925 A | 4/1932 | Gomery |
| 2,793,018 A | 5/1957 | Trombe |
| 2,846,724 A | 8/1958 | Aylwin |
| 2,945,417 A | 7/1960 | Caryl et al. |
| 3,026,858 A | 3/1962 | Fleischer |
| 3,311,458 A | 3/1967 | Schunemann |
| 3,464,885 A | 9/1969 | Land et al. |
| 3,466,119 A | 9/1969 | Giovanni |
| 3,861,379 A | 1/1975 | Anderson, Jr. |
| 3,884,217 A | 5/1975 | Wartes |
| 3,889,531 A | 6/1975 | Suga |
| 3,892,433 A | 7/1975 | Blake |
| 3,920,413 A | 11/1975 | Lowery |
| 3,956,030 A | 5/1976 | Lee et al. |
| 3,986,021 A | 10/1976 | Hitchcock |
| 3,995,429 A | 12/1976 | Peters |
| 4,000,851 A | 1/1977 | Heilemann |
| 4,022,184 A | 5/1977 | Anderson |
| 4,033,118 A | 7/1977 | Powell |
| 4,054,246 A | 10/1977 | Johnson |
| 4,056,313 A | 11/1977 | Arbogast |
| 4,069,674 A | 1/1978 | Warren |
| 4,071,017 A | 1/1978 | Russell, Jr. et al. |
| 4,078,549 A | 3/1978 | McKeen et al. |
| 4,081,966 A | 4/1978 | deGeus |
| 4,088,120 A | 5/1978 | Anderson |
| 4,091,622 A | 5/1978 | Marchesi |
| 4,106,485 A | 8/1978 | Polley |
| 4,108,154 A | 8/1978 | Nelson |
| 4,111,184 A | 9/1978 | Fletcher et al. |
| 4,116,225 A | 9/1978 | Ortabasi |
| 4,117,682 A | 10/1978 | Smith |
| 4,122,833 A | 10/1978 | Lovelace et al. |
| 4,124,061 A | 11/1978 | Mitchell et al. |
| 4,136,671 A | 1/1979 | Whiteford |
| 4,138,995 A | 2/1979 | Yuan |
| 4,141,626 A | 2/1979 | Treytl et al. |
| 4,144,716 A | 3/1979 | Chromie |
| 4,144,875 A | 3/1979 | Bruno et al. |
| 4,146,057 A | 3/1979 | Friedman et al. |
| 4,148,164 A | 4/1979 | Humphrey |
| 4,149,523 A | 4/1979 | Boy-Marcotte et al. |
| 4,157,290 A | 6/1979 | Ladislav et al. |
| 4,159,710 A | 7/1979 | Prast |
| 4,172,443 A | 10/1979 | Sommer |
| 4,174,704 A | 11/1979 | Nelson |
| 4,177,325 A | 12/1979 | Roberts et al. |
| 4,184,477 A | 1/1980 | Yuan |
| 4,203,426 A | 5/1980 | Matlock et al. |
| 4,205,660 A | 6/1980 | Kellberg et al. |
| 4,210,201 A | 7/1980 | O'Hanlon |
| 4,210,463 A | 7/1980 | Escher |
| 4,215,553 A | 8/1980 | Poirier et al. |
| 4,220,140 A | 9/1980 | Francia |
| 4,222,365 A | 9/1980 | Thomson |
| 4,229,076 A | 10/1980 | Chromie |
| 4,238,265 A | 12/1980 | Deminet |
| 4,239,344 A | 12/1980 | Wildenrotter |
| 4,243,018 A | 1/1981 | Hubbard |
| 4,249,514 A | 2/1981 | Jones |
| 4,263,895 A | 4/1981 | Colao |
| 4,267,881 A | 5/1981 | Byerly |
| 4,268,332 A | 5/1981 | Winders |
| 4,270,600 A | 6/1981 | Bourdin |
| 4,281,640 A | 8/1981 | Wells |
| 4,281,642 A | 8/1981 | Steinberg |
| 4,289,115 A | 9/1981 | O'Hanlon |
| 4,291,677 A | 9/1981 | Monk |
| 4,304,221 A | 12/1981 | Trihey |
| 4,312,324 A | 1/1982 | Ross et al. |
| 4,333,447 A | 6/1982 | Lemrow et al. |
| 4,337,827 A | 7/1982 | Jabsen |
| 4,339,484 A | 7/1982 | Harding |
| 4,343,298 A | 8/1982 | Ambille et al. |
| 4,348,135 A | 9/1982 | St. Clair |
| 4,367,365 A | 1/1983 | Spencer |
| 4,375,806 A | 3/1983 | Nishman |
| 4,385,430 A | 5/1983 | Bartels |
| 4,388,966 A | 6/1983 | Spiegel |
| 4,389,464 A | 6/1983 | Muhlratzer |
| 4,394,859 A | 7/1983 | Drost |
| 4,414,812 A | 11/1983 | Parry |
| 4,416,264 A | 11/1983 | Herrick et al. |
| 4,422,893 A | 12/1983 | Duchateau et al. |
| 4,424,803 A | 1/1984 | Bogardus |
| 4,429,178 A | 1/1984 | Prideaux et al. |
| 4,434,785 A | 3/1984 | Knudsen |
| 4,435,043 A | 3/1984 | Mertens et al. |
| 4,436,373 A | 3/1984 | Kirsch |
| 4,445,499 A | 5/1984 | Platell |
| 4,454,371 A | 6/1984 | Folino |
| 4,459,972 A | 7/1984 | Moore |
| 4,462,391 A | 7/1984 | Laussermair et al. |
| 4,468,848 A | 9/1984 | Anderson et al. |
| 4,488,540 A | 12/1984 | Mcalister |
| 4,505,260 A | 3/1985 | Metzger |
| 4,511,756 A | 4/1985 | Moeller et al. |
| 4,512,336 A | 4/1985 | Wiener |
| 4,515,148 A | 5/1985 | Boy-Marcotte et al. |
| 4,520,794 A | 6/1985 | Stark et al. |
| 4,526,005 A | 7/1985 | Laing et al. |
| 4,532,916 A | 8/1985 | Aharon |
| 4,553,531 A | 11/1985 | Rosende |
| 4,559,926 A | 12/1985 | Butler |
| 4,586,489 A | 5/1986 | Voll et al. |
| 4,611,090 A | 9/1986 | Catella et al. |
| 4,611,575 A | 9/1986 | Powell |
| 4,628,905 A | 12/1986 | Mills |
| 4,643,212 A | 2/1987 | Rothrock |
| 4,730,423 A | 3/1988 | Hughes |
| 4,730,602 A | 3/1988 | Posnansky et al. |
| 4,738,304 A | 4/1988 | Chalmers et al. |
| 4,815,433 A | 3/1989 | Wild |
| 4,815,443 A | 3/1989 | Vrolyk et al. |
| 4,820,033 A | 4/1989 | Sick |
| 4,820,395 A | 4/1989 | Angelini |
| 4,890,599 A | 1/1990 | Eiden |
| 5,058,565 A | 10/1991 | Gee et al. |
| 5,113,659 A | 5/1992 | Baker et al. |
| 5,125,608 A | 6/1992 | McMaster et al. |
| 5,143,556 A | 9/1992 | Matlin |
| 5,228,924 A | 7/1993 | Barker et al. |
| 5,259,479 A | 11/1993 | St-Germain |
| 5,272,879 A | 12/1993 | Wiggs |
| 5,275,150 A | 1/1994 | Lai |
| 5,325,844 A | 7/1994 | Rogers et al. |
| 5,374,317 A * | 12/1994 | Lamb et al. .................. 136/246 |
| 5,523,132 A | 6/1996 | Zhang et al. |
| 5,542,409 A | 8/1996 | Sampayo |
| 5,578,140 A | 11/1996 | Yogev et al. |
| 5,643,423 A | 7/1997 | Kimock et al. |
| 5,777,587 A | 7/1998 | Tsuru et al. |
| 5,860,414 A | 1/1999 | Steinmann |
| 5,862,799 A | 1/1999 | Yogev et al. |
| 5,894,838 A | 4/1999 | Yogey |
| 5,899,199 A | 5/1999 | Mills |
| 5,931,158 A | 8/1999 | Buck |
| 6,000,211 A | 12/1999 | Bellac et al. |
| 6,003,508 A | 12/1999 | Hoffschmidt et al. |
| 6,035,850 A | 3/2000 | Deidewig et al. |
| 6,066,187 A | 5/2000 | Jensen et al. |
| 6,131,565 A | 10/2000 | Mills |
| 6,141,949 A | 11/2000 | Steinmann |
| 6,177,131 B1 | 1/2001 | Glaubitt et al. |
| 6,201,181 B1 | 3/2001 | Azzam et al. |
| 6,227,280 B1 | 5/2001 | Wirth et al. |
| 6,234,166 B1 | 5/2001 | Katsir et al. |
| 6,240,682 B1 | 6/2001 | James et al. |
| 6,279,312 B1 | 8/2001 | Hennecke |
| 6,344,272 B1 | 2/2002 | Oldenburg et al. |
| 6,349,718 B1 | 2/2002 | Ven et al. |
| 6,396,239 B1 | 5/2002 | Benn et al. |

(56) References Cited

U.S. PATENT DOCUMENTS

| | | | |
|---|---|---|---|
| 6,470,644 B2 | 10/2002 | James et al. |
| 6,484,506 B1 | 11/2002 | Bellac et al. |
| 6,530,369 B1 | 3/2003 | Yogev et al. |
| 6,532,953 B1 | 3/2003 | Blackmon et al. |
| 6,543,441 B2 | 4/2003 | Fünger et al. |
| 6,632,542 B1 | 10/2003 | Mahoney et al. |
| 6,668,555 B1 | 12/2003 | Moriarty |
| 6,668,820 B2 | 12/2003 | Cohen et al. |
| 6,722,357 B2 | 4/2004 | Shingleton |
| 6,752,434 B2 | 6/2004 | Cummins |
| 6,772,570 B2 | 8/2004 | Horne |
| 6,783,653 B2 | 8/2004 | Mahoney et al. |
| 6,902,203 B2 | 6/2005 | Kang |
| 6,906,842 B2 | 6/2005 | Agrawal et al. |
| 6,911,110 B2 | 6/2005 | Blackmon, Jr. et al. |
| 6,941,759 B2 | 9/2005 | Bellac et al. |
| 6,959,993 B2 | 11/2005 | Gross et al. |
| 6,968,654 B2 | 11/2005 | Moulder et al. |
| 6,971,756 B2 | 12/2005 | Vasylyev et al. |
| 6,994,082 B2 | 2/2006 | Hochberg et al. |
| 7,041,342 B2 | 5/2006 | Lohmeyer et al. |
| 7,051,529 B2 | 5/2006 | Murphy et al. |
| 7,055,519 B2 | 6/2006 | Litwin |
| 7,140,181 B1 | 11/2006 | Jensen et al. |
| 7,156,088 B2 | 1/2007 | Luconi |
| 7,191,597 B2 | 3/2007 | Goldman |
| 7,192,146 B2 | 3/2007 | Gross et al. |
| 7,207,327 B2 | 4/2007 | Litwin et al. |
| 7,249,937 B2 | 7/2007 | Inoue et al. |
| 7,296,410 B2 | 11/2007 | Litwin |
| 7,299,633 B2 | 11/2007 | Murphy et al. |
| 7,395,820 B2 | 7/2008 | Kuckelkorn |
| 7,412,976 B2 | 8/2008 | Winston |
| 7,432,488 B1 | 10/2008 | Hines et al. |
| 7,479,350 B1 | 1/2009 | Neumann et al. |
| 7,492,120 B2 | 2/2009 | Benn et al. |
| 7,531,741 B1 | 5/2009 | Melton et al. |
| 7,926,480 B2 | 4/2011 | Le Lievre |
| 7,926,481 B2 | 4/2011 | Edwards et al. |
| 7,950,386 B2 | 5/2011 | Lievre |
| 7,975,686 B2 | 7/2011 | Prueitt |
| 7,992,553 B2 | 8/2011 | Le Lievre |
| 8,056,555 B2 | 11/2011 | Prueitt |
| 8,203,110 B2 | 6/2012 | Silvestre |
| 2002/0078945 A1 | 6/2002 | Funger et al. |
| 2002/0180404 A1 | 12/2002 | Benn et al. |
| 2003/0034029 A1 | 2/2003 | Shingleton |
| 2003/0137754 A1 | 7/2003 | Vasylyev et al. |
| 2003/0173469 A1 | 9/2003 | Kudija, Jr. et al. |
| 2004/0004175 A1 | 1/2004 | Nakamura |
| 2004/0074490 A1 | 4/2004 | Mills et al. |
| 2004/0128923 A1 | 7/2004 | Moulder et al. |
| 2004/0139689 A1 | 7/2004 | Sinha et al. |
| 2004/0139960 A1 | 7/2004 | Blackmon, Jr. et al. |
| 2004/0231716 A1 | 11/2004 | Litwin |
| 2004/0261334 A1 | 12/2004 | Liebendorfer et al. |
| 2004/0261788 A1 | 12/2004 | Winston |
| 2005/0126170 A1 | 6/2005 | Litwin |
| 2005/0126560 A1 | 6/2005 | Litwin |
| 2005/0150225 A1 | 7/2005 | Gwiazda et al. |
| 2005/0189525 A1 | 9/2005 | Kuckelkorn et al. |
| 2005/0229924 A1 | 10/2005 | Luconi et al. |
| 2005/0279095 A1 | 12/2005 | Goldman |
| 2005/0279953 A1 | 12/2005 | Gerst |
| 2005/0284467 A1 | 12/2005 | Patterson |
| 2006/0107664 A1 | 5/2006 | Hudson et al. |
| 2006/0144393 A1 | 7/2006 | Le Lievre |
| 2006/0150967 A1 | 7/2006 | Hoelle et al. |
| 2006/0157050 A1 | 7/2006 | Le Lievre |
| 2006/0181765 A1 | 8/2006 | Jorgensen et al. |
| 2006/0225729 A1 | 10/2006 | Litwin |
| 2006/0260314 A1 | 11/2006 | Kincaid et al. |
| 2006/0266039 A1 | 11/2006 | Skowronski et al. |
| 2007/0012041 A1 | 1/2007 | Goldman |
| 2007/0035864 A1 | 2/2007 | Vasylyev et al. |
| 2007/0084208 A1 | 4/2007 | Goldman |
| 2007/0157614 A1 | 7/2007 | Goldman |
| 2007/0157923 A1* | 7/2007 | Le Lievre ..................... 126/692 |
| 2007/0221208 A1 | 9/2007 | Goldman |
| 2007/0227573 A1 | 10/2007 | Hunter et al. |
| 2008/0000231 A1 | 1/2008 | Litwin et al. |
| 2008/0011290 A1 | 1/2008 | Goldman et al. |
| 2008/0029150 A1 | 2/2008 | Quero et al. |
| 2008/0034757 A1 | 2/2008 | Skowronski et al. |
| 2008/0127647 A1 | 6/2008 | Leitner |
| 2008/0128017 A1 | 6/2008 | Ford |
| 2008/0134679 A1 | 6/2008 | Cavanaugh et al. |
| 2008/0184789 A1 | 8/2008 | Eck et al. |
| 2008/0230108 A1 | 9/2008 | Keshner et al. |
| 2008/0236571 A1 | 10/2008 | Keshner et al. |
| 2008/0271731 A1 | 11/2008 | Winston |
| 2008/0302314 A1 | 12/2008 | Gonzalez et al. |
| 2008/0308094 A1 | 12/2008 | Johnston |
| 2009/0032095 A1 | 2/2009 | Schultz et al. |
| 2009/0056699 A1 | 3/2009 | Mills et al. |
| 2009/0056701 A1 | 3/2009 | Mills et al. |
| 2009/0056703 A1 | 3/2009 | Mills et al. |
| 2009/0084760 A1 | 4/2009 | Mayer et al. |
| 2009/0090109 A1 | 4/2009 | Mills et al. |
| 2009/0101138 A1 | 4/2009 | Eck et al. |
| 2009/0107487 A1 | 4/2009 | Gee et al. |
| 2009/0107488 A1 | 4/2009 | Gee et al. |
| 2009/0107489 A1 | 4/2009 | Gee et al. |
| 2009/0121495 A1 | 5/2009 | Mills |
| 2009/0126364 A1 | 5/2009 | Mills et al. |
| 2009/0139515 A1 | 6/2009 | Gee et al. |
| 2009/0199888 A1 | 8/2009 | Kuhn |
| 2009/0205637 A1 | 8/2009 | Moore et al. |
| 2009/0208761 A1 | 8/2009 | Silmy et al. |
| 2009/0322089 A1 | 12/2009 | Mills et al. |
| 2010/0071683 A1* | 3/2010 | Selig et al. ..................... 126/605 |

FOREIGN PATENT DOCUMENTS

| | | |
|---|---|---|
| DE | 2945908 A1 | 5/1981 |
| DE | 3003962 A1 | 8/1981 |
| DE | 9417466 U1 | 2/1995 |
| DE | 19619021 A1 | 11/1997 |
| DE | 19723543 A1 | 12/1998 |
| DE | 19740644 A1 | 3/1999 |
| DE | 19932646 A1 | 2/2000 |
| DE | 19854391 A1 | 5/2000 |
| DE | 10328321 A1 | 1/2005 |
| DE | 102007052234 A1 | 4/2009 |
| EP | 0012037 A1 | 6/1980 |
| EP | 00129821 A2 | 1/1985 |
| EP | 0151045 A2 | 8/1985 |
| EP | 00526816 A1 | 2/1993 |
| EP | 1164337 A1 | 12/2001 |
| EP | 0986695 B1 | 6/2002 |
| EP | 1243872 A2 | 9/2002 |
| EP | 1056978 B1 | 10/2002 |
| EP | 1291591 A2 | 3/2003 |
| EP | 0815401 B1 | 5/2003 |
| EP | 1519108 A1 | 3/2005 |
| EP | 1537921 A1 | 6/2005 |
| EP | 1598608 A2 | 11/2005 |
| EP | 1610073 A2 | 12/2005 |
| EP | 1746363 A2 | 1/2007 |
| EP | 1754942 A1 | 2/2007 |
| EP | 1764565 A1 | 3/2007 |
| EP | 1795829 A2 | 6/2007 |
| EP | 1801517 A1 | 6/2007 |
| EP | 1873397 A2 | 1/2008 |
| EP | 1930587 A2 | 6/2008 |
| EP | 2000669 A2 | 12/2008 |
| EP | 2053242 A2 | 4/2009 |
| EP | 2093518 A1 | 8/2009 |
| EP | 2093520 A2 | 8/2009 |
| FR | 1520370 A | 4/1968 |
| FR | 2391420 A1 | 12/1978 |
| FR | 2637967 A1 | 4/1990 |
| GB | 2037977 A | 7/1980 |
| GB | 2054829 A | 2/1981 |

(56) References Cited

FOREIGN PATENT DOCUMENTS

| | | |
|---|---|---|
| GB | 2154729 A | 9/1985 |
| JP | 56-002441 A | 1/1981 |
| JP | 58-62460 A | 4/1983 |
| JP | 58-86353 A | 5/1983 |
| JP | 58-150753 A | 9/1983 |
| JP | 63-183346 A | 7/1988 |
| JP | 2-110254 A | 4/1990 |
| JP | 8-184063 A | 7/1996 |
| JP | 2000-97498 A | 4/2000 |
| JP | 2004-69197 A | 3/2004 |
| WO | 90/10182 A1 | 9/1990 |
| WO | 95/21358 A1 | 8/1995 |
| WO | 96/29745 A1 | 9/1996 |
| WO | 96/30705 A1 | 10/1996 |
| WO | 97/01030 A2 | 1/1997 |
| WO | 97/14887 A1 | 4/1997 |
| WO | 98/55740 A1 | 12/1998 |
| WO | 99/42765 A1 | 8/1999 |
| WO | 99/64795 A2 | 12/1999 |
| WO | 00/33001 A1 | 6/2000 |
| WO | 01/61254 A1 | 8/2001 |
| WO | 01/72508 A1 | 10/2001 |
| WO | 02/02995 A2 | 1/2002 |
| WO | 02/12799 A2 | 2/2002 |
| WO | 02/25184 A1 | 3/2002 |
| WO | 02/075225 A2 | 9/2002 |
| WO | 02/098553 A1 | 12/2002 |
| WO | 2004/066401 A2 | 8/2004 |
| WO | 2004/094924 A2 | 11/2004 |
| WO | 2005/003646 A1 | 1/2005 |
| WO | 2005/003647 A1 | 1/2005 |
| WO | 2005/010225 A1 | 2/2005 |
| WO | 2005/071325 A1 | 8/2005 |
| WO | 2005/078360 A1 | 8/2005 |
| WO | 2005/088218 A1 | 9/2005 |
| WO | 2005/119136 A1 | 12/2005 |
| WO | 2006/000834 A1 | 1/2006 |
| WO | 2006/005303 A1 | 1/2006 |
| WO | 2006/008433 A1 | 1/2006 |
| WO | 2006/073357 A1 | 7/2006 |
| WO | 2007/022756 A2 | 3/2007 |
| WO | 2007/031062 A1 | 3/2007 |
| WO | 2007/076282 A2 | 7/2007 |
| WO | 2007/087680 A1 | 8/2007 |
| WO | 2007/104080 A1 | 9/2007 |
| WO | 2007/108976 A2 | 9/2007 |
| WO | 2007/118223 A2 | 10/2007 |
| WO | 2007/147399 A2 | 12/2007 |
| WO | 2008/006174 A1 | 1/2008 |
| WO | 2008/022409 A1 | 2/2008 |
| WO | 2008/027041 A1 | 3/2008 |
| WO | 2008/058528 A1 | 5/2008 |
| WO | 2008/058866 A1 | 5/2008 |
| WO | 2008/092194 A1 | 8/2008 |
| WO | 2008/092195 A1 | 8/2008 |
| WO | 2008/115305 A2 | 9/2008 |
| WO | 2008/118980 A1 | 10/2008 |
| WO | 2008/121335 A1 | 10/2008 |
| WO | 2008/121672 A1 | 10/2008 |
| WO | 2008/128237 A1 | 10/2008 |
| WO | 2008/128746 A2 | 10/2008 |
| WO | 2008/153946 A2 | 12/2008 |
| WO | 2008/154521 A1 | 12/2008 |
| WO | 2008/154599 A1 | 12/2008 |
| WO | 2009/015388 A2 | 1/2009 |
| WO | 2009/029275 A2 | 3/2009 |
| WO | 2009/029277 A2 | 3/2009 |
| WO | 2009/051595 A1 | 4/2009 |
| WO | 2009/106103 A1 | 9/2009 |
| WO | 2009/106104 A1 | 9/2009 |

OTHER PUBLICATIONS

FMC Corporation, "Solar Thermal Central-Receiver Research Study", DOE/ET/20426-T6, Appendix A,B,C,D, Feb. 1977, 160 pages.

Freiburg et al., "Solar unterstutzte Konventionelle Kraftwerke fur Mittel—und Sudeuropa", BWK Bd., vol. 46, No. 5, May 1994, pp. 247-253 (11 pages of English Translation and 7 pages of Original Document).

Freiburg, Marko A., "Verbesserung fossilgefeuerter Dampfkraftwerke durch solare Wärmezufuhr", BWK, vol. 47, No. 7/8, Jul./Aug. 1995, pp. 303-308 (13 pages of English Translation and 7 pages of Original Documents).

Goebel et al., "Parabolic Trough Collector with Foldable Reflector FC1: Design, Test Programme and Experiences", Proceedings of the 11th SolarPACES International Symposium on Concentrated Solar Power and Chemical Technologies, Zurich, Switzerland, Sep. 4-6, 2002, Sep. 2002, 5 pages.

Gorman, D. N., "Assessment of Central Receiver Solar Thermal Enhanced Oil Recovery Systems", Thermal Power Systems, Contract No. 98/3601, Jul. 1987, 117 pages.

Hassoun et al., "Electrodeposited Ni-Sn Intermetallic Electrodes for Advanced Lithium Ion Batteries", Journal of Power Sources, vol. 160, 2006, pp. 1336-1341.

Hollis, Steve, "A New Thermal Energy Storage System", 82nd Annual EESA Conference Trade Exhibition—Electricity 2006, At the Flick of a Switch, Melbourne, Australia, Aug. 2006, 20 pages.

Katumba et al., "Selective Solar Absorbers: A Cost Effective Solution for Access to Clean Energy in Rural Africa", Presented at 2nd CSIR Biennial Conference, CSIR International Conference, Centre Pretoria, South Africa, Nov. 17-18, 2008, pp. 1-9.

Katumba et al., "Solar Selective Absorber Functionality of Carbon Nanoparticles Embedded in $SiO_2$, ZnO and NiO Matrices", Physica Status Solidi (c), vol. 5, No. 2, 2008, pp. 549-551.

Katumba et al., "Solar Selective Absorber Functionality of Carbon Nanoparticles Embedded in $SiO_2$, ZnO and NiO Matrices", SAIP 2006, University of Zimbabwe, Harare, Zimbabwe, 2006, 29 pages.

Kennedy et al., "Development and Testing of High-Temperature Solar Selective Coatings", Presented at the 2004 DOE Solar Energy Technologies Program Review Meeting, Denver, Colorado, Oct. 25-28, 2004, 5 pages.

Kennedy et al., "Progress Toward Developing a Durable High-Temperature Solar Selective Coating", 2007 Parabolic Trough Technologies Workshop, Golden, Colorado, Mar. 8-9, 2007, 1 page.

Kennedy, Cheryl E., "Session: CSP Advanced Systems: Optical Materials Organization: National Renewable Energy Laboratory", NREL, 2008 Solar Annual Review Meeting, Austin, Texas, Apr. 22-24, 2008, 30 pages.

Kennedy, Cheryl E., "Advances in Concentrating Solar Power Collectors: Mirrors and Solar Selective Coating", AIMCAL, Scottsdale, Arizona, Oct. 10, 2007, pp. 1-69.

Kennedy, Cheryl E., "Progress to Develop an Advanced Solar-Selective Coating", 14th Biennial CSP SolarPACES Symposium, Las Vegas, Nevada, Mar. 4-7, 2008, pp. 1-9.

Kennedy, Cheryl E., "Review of Mid- to High-Temperature Solar Selective Absorber Materials", Technical Report—NREL, Jul. 2002, 58 pages.

Kunstle et al., "Solar Powered Combined Cycle Plant", Power-Gen Europe '94, Cologne, Germany, vol. 6/7, May 17-19, 1994, pp. 134-151.

Laing, Doerte, "Concrete Storage Development for Parabolic Trough Power Plants", Parabolic Trough Technology Workshop, Golden, CO, Mar. 8, 2007, pp. 1-17.

Laing, Doerte, "Storage Development for Direct Stream Generation Power Plants", Parabolic Trough Technology Workshop, Golden, CO, Mar. 9, 2007, pp. 1-21.

Le Lievre et al., "Design of 6.5 MW Solar Thermal Electricity Plant with Zero Fossil Fuel Backup", ANZSES Annual Conference—Clean Energy?—Can Do!, Canberra, Australia, 2006, pp. 1-7.

Library of Congress, "Application of Solar Technology to Today's Energy Needs—vol. I", Chapter VIII, titled "Collectors", Office of

(56) References Cited

OTHER PUBLICATIONS

Technology Assessment, Library of Congress Card Catalog No. 78-600060, Jun. 1978, pp. 245-326.
Library of Congress, "Application of Solar Technology to Today's Energy Needs—vol. I", Chapter IX, titled "Energy Conversion with Heat Engines", Office of Technology Assessment, Library of Congress Card Catalog No. 78-600060, Jun. 1978, pp. 329-389.
Library of Congress, "Application of Solar Technology to Today's Energy Needs—vol. I", Chapter XI, titled "Energy Storage", Office of Technology Assessment, Library of Congress Card Catalog No. 78-600060, Jun. 1978, pp. 429-483.
Lippke, Franc, "Numerische Simulation der Absorberdynamik von Parabolrinnen-Solar-kraftwerken mit direkter Dampferzeugung", VDI Publishing House, vol. 6, No. 307, 1994, 232 pages. (107 pages of English Translation and 125 pages of Original Document).
Lloyd Energy, "Cloncurry Solar Thermal Storage Project", available online at <http://web.archive.org/web/20080719080141/http:/www.lloydenergy.com/presentations.php>, Jul. 19, 2008, 15 pages.
Lloyd Energy, "Frequently Asked Questions—Cloncurry Solar Power Pilot Project", available online at <http://web.archive.org/web/20080719211253/www.lloydenergy.com/presentations/cloncurry+Solar-Thermal+Storage+Project+FAQ.pdf>, Nov. 7, 2007, 3 pages.
Lloyd Energy, "Lake Cargelligo Solar Thermal Storage Project", available online at <http://web.archive.org/web/2008071908141/http:/www.lloydenergy.com/presentations.php>, Jul. 19, 2008, 16 pages.
Lovegrove et al., "Developing Ammonia Based Thermo-chemical Energy Storage for Dish Power Plants", Solar Energy, vol. 76, 2004, pp. 331-337.
Lovegrove et al., "Endothermic Reactors for an Ammonia Based Thermo-chemical Solar Energy Storage and Transport System", Solar Energy, vol. 56, No. 4, 1996, pp. 361-371.
Mertins et al., "Geometry Optimization of Fresnel-Collectors with Economic Assessment", Jan. 1, 2004, 8 pages.
Mills et al., "Case Study: Low Cost Solar Thermal Power Development in NSW", Proceedings at Enviro 2004, Mar. 28, 2004, 7 pages.
Mills et al., "Cheaper Than Coal?", International Solar Energy Society Solar World Congress, Orlando, Florida, Aug. 6-12, 2005, 8 pages.
Mills et al., "Compact Linear Fresnel Reflector Progress", SolarPACES 2006, A7-S2, 2006, pp. 1-7.
Mills et al., "The Future for Solar Thermal", Proceedings of the 8th Renewable & Sustainable Power Conference, ESAA Alice Springs, Aug. 2002, pp. 1-20.
Mills et al., U.S. Appl. No. 60/934,549, filed on Jun. 13, 2007.
Mills et al., U.S. Appl. No. 61/007,926, filed on Aug. 27, 2007.
Mills et al., U.S. Appl. No. 60/933,574, filed on Jun. 6, 2007.
Mills et al., U.S. Appl. No. 60/933,615, filed on Jun. 6, 2007.
Mills et al., U.S. Appl. No. 60/933,619, filed on Jun. 6, 2007.
Mills et al., U.S. Appl. No. 60/933,620, filed on Jun. 6, 2007.
Mills et al., U.S. Appl. No. 60/933,637, filed on Jun. 6, 2007.
Mills et al., U.S. Appl. No. 60/933,648, filed on Jun. 6, 2007.
Morrison, Graham, "Large Scale Solar Thermal Electricity", Australia-China Energy Symposium, Nov. 2006, 25 pages.
Nava et al., "Trough Thermal Storage—Status Spring 2007", NREL/DLR Trough Workshop, Denver, Mar. 2007, 19 pages.
NIR News, "A Celebration of Near Infrared Spectroscopy", The Newsletter of the International Council for Near Infrared Spectroscopy, vol. 16, No. 7, Oct./Nov. 2005, 30 pages.
NREL, "Survey of Thermal Storage for Parabolic Trough Power Plants", Pilkington Solar International GmbH, Cologne, Germany, Sep. 13, 1999-Jun. 12, 2000, 61 pages.
Odeh et al., "Hydrodynamic Model for Horizontal and Inclined Solar Absorber Tubes for Direct Steam Generation Collectors", 13th Australasian Fluid Mechanics Conference, Monash University, Melbourne, Australia, Dec. 13-18, 1998, 4 pages.
Odeh et al., "Performance of Horizontal and Inclined Direct Steam Generation Trough Solar Collectors", ANZSES 1998, Perth, Australia, Oct. 1998, 8 pages.
Official Committee Hansard, "House of Representatives: Standing Committee on Industry and Resources", available online at <http://www.ah.gov.au/hansard/reps/committee/r10386.htm>, Aug. 9, 2007, 18 pages.
Pacheco et al., "Development of a Molten-Salt Thermocline Thermal Storage System for Parabolic Trough Plants", Proceedings of Solar Forum 2001, Solar Energy: The Power to Choose, Washington, D.C., Apr. 21-25, 2001, 9 pages.
Pacheco et al., "Development of Molten-Salt Thermocline Thermal Storage System for Parabolic Trough Plants", Journal of Solar Energy Engineering, vol. 124, May 2002, pp. 153-159.
Passo, Janne, "Moisture Depth Profiling in Paper Using Near-Infrared Spectroscopy", VTT Technical Research Centre of Finland, Nov. 2007, 204 pages.
Peterson, Josh, "Super-Concrete to Store Solar Power Works: TreeHugger", Available at <http://www.treehugger.com/files/2008/12/thermal-storage-concrete.php>, Dec. 2008, pp. 1-5.
Reynolds et al., "An Experimental and Computational Study of the Heat Loss Characteristics of a Trapezoidal Cavity Absorber", Solar Energy, vol. 76, 2004, pp. 229-234.
Reynolds, David J., "A Thermal and Hydrodynamic Model for a Compact Linear Fresnel Reflector-Type Solar Thermal Collector", University of New South Wales, 2005, 291 pages.
Riesenkampf et al., "New High-Tin Phase Found in Electrolytic Sn-Ni Deposits", Journal of Materials Science, vol. 36, No. 19, Oct. 2001, pp. 4633-4636. (Abstract Only).
Schramek et al., "Heliostats for Maximum Ground Coverage", Energy, vol. 29, 2004, pp. 701-713.
Seri, "Phase-Change Thermal Energy Storage", Final Subcontract Report on the Symposium Held Oct. 19-20, 1988, Helendale, California, U.S. Department of Energy Contract No. DE-AC0283CH10093, Nov. 1989, 151 pages.
SolarPACES, "SolarPACES 2009 Program", Berlin Germany, Sep. 15-18, 2009, 19 pages.
Stanley et al., "An Overview of Engineering and Agricultural Design Considerations of the Raft River Soil-Warming and Heat Dissipation Experiment", EG&G Idaho, Inc., U.S. Department of Energy Idaho Operations Office Under DOE Contact No. DE-AC07-76ID01570, Apr. 1982, pp. 1-23.
Stine et al., "Power Cycles for Solar Applications", Chapter 12, Solar Energy Fundamentals and Design with Computer Applications, John Wiley & Sons, New York, 1985, pp. 281-334.
Stine et al., "Solar Energy Fundamentals and Design with Computer Applications", John Wiley & Sons, New York, (Table of Contents only), 1985, pp. xiii-xiv.
Stine et al., "Solar Thermal Projects", Chapter 14 in Solar Energy Fundamentals and Design with Computer Applications, John Wiley & Sons, New York, 1985, pp. 364-396.
Mills et al., U.S. Appl. No. 11/895,869, filed on Aug. 27, 2007.
Tamaura et al., "A Novel Beam Down System for Solar Power Generation with Multi-ring Central Reflectors and Molten Salt Thermal Storage", Presented at 13th International Symposium on Concentrating Solar Power and Chemical Energy Technologies, Seville, Spain, Available at <http://www.fundacionsener.es/EPORTAL_DOCS/GENERAL/FILE-cw7646d431b8c543d7b45a/ANOVELBEAM-DOWNSYSTEM.pdf>, Jun. 20-23, 2006, pp. 1-8.
Tamme, Rainer, "Future Storage System", World Solar Power, Seville, Spain, Oct. 24-26, 2007, pp. 1-22.
Tamme, Rainer, "Storage Technology for Process Heat Applications", Preheat Symposium, Freiburg, Germany, Jun. 21, 2007, pp. 1-24.
Tamme, Rainer, "TES for Process Heat and Power Generation", Symposium "Material Development for Thermal Energy Storage," Phase Change Materials and Chemical Reaktions, Bad Tolz, Germany, Jun. 4-6, 2008, pp. 1-25.
Tamme, Rainer, "Thermal Energy Storage: Concrete & Phase Changes TES", 2006 Parabolic Trough Technology Workshop, Incline Village, Nevada, Feb. 13, 2006, pp. 1-28.
Tanner, A. R., "Application of Underground Thermal Energy Storage for Solar Thermal Power Generation in New South Wales", School of Aerospace, Mechanical and Mechatronic Engineering, The University of Sydney, Nov. 2003, 124 pages.

(56) References Cited

OTHER PUBLICATIONS

Tegehall, Per-Erik, "Review of the Impact of Intermetallic Layers on the Brittleness of Tin-Lead and Lead-Free Solder Joints", IVF Project Report 06/07, Mar. 2006, pp. 1-63.

Tesfamicharel, Tuquabo, "Characterization of Selective Solar Absorbers: Experimental and Theoretical Modeling", ACTA Universitatis Upsaliensis Uppsala, 2000, pp. 1-79.

The Aerospace Corporation, "Evaluation of the FMC Line Cavity Central Receiver Concept", National Technical Information Service, Apr. 1977, pp. 1-26.

The Oil Drum, "Storing Energy Using Graphite", Australia and New Zealand, available online at <http://anz.theoildrum.com/node/3608>, Feb. 12, 2008, 7 pages.

Tomlinson et al., "Substrate Roughness, Deposit Thickness and the Corrosion of Electroless Nickel Coatings", Journal of Material Science, vol. 25, 1990, pp. 4972-4976.

Tully et al., "Paraboloid simple and compound cone concentrators for spherical absorbers", Solar Energy, Pergamon Press. Oxford, GB, vol. 29, No. 2, XP025415037, ISSN: 0038-092X, 001: 10.1016/0038-092X(82)90179-7, Jan. 1, 1982, 167-174 pages.

Turkenburg et al., "Renewable Energy Technologies", Chapter 7 in World Energy Assessment: Energy and the Challenge of Sustainability, 2000, pp. 220-272.

Turner et al., "High Temperature Thermal Energy Storage in Moving Sand", Proceedings of the 13th Intersociety Energy Conversion Engineering Conference, San Diego, CA, Aug. 20-25, 1978, pp. 923-927.

Turner, Robert H., "High Temperature Thermal Energy Storage", Part I and Part II, The Franklin Institute Press, Philadelphia, Pennsylvania, 1978, 51 pages.

Turner, Robert H., "High Temperature Thermal Energy Storage in Steel and Sand", DOE/NASA/0100-79-1, Dec. 15, 1979, 95 pages.

Von Tobias Mauelshagen, "Technologie der Solar Power Group am Beispiel Eines 10MWe Frosenelkraftwerkes", Solar Power Group Workshop, Solar Power Group GmbH, Berlin, Germany, Available at <http://www.mss-csp.info/cms/upload/pdf/Berlin_Nov_2008/7.Solar_Power_Group_Prsentation_Mauelshagen_Workshop_Berlin_20112008.pd>, Nov. 20, 2008, pp. 1-31.

Wynne et al., "The Transformation on Annealing of the Metastable Electrodeposit, NiSnx, to Its Equilibrium Phases", Metallurgical Transactions, vol. 3, Jan. 1972, pp. 301-305.

Zollner et al., "Rechnerische Simulation von Heizkraftprozessen als Instrument zur Parametervariation and Optimierung", FWI, vol. 18, No. 5, 1989, pp. 466-471.

Zoschak et al., "Studies of the Direct Input of Solar Energy to a Fossil-Fueled Central Station Steam Power Plants", Solar Energy, vol. 17, 1975, pp. 297-305.

Non Final Office Action received for U.S. Appl. No. 12/012,829, mailed on Dec. 7, 2011, 16 pages.

Final Office Action received for U.S. Appl. No. 12/012,829, mailed on Jul. 20, 2012, 13 pages.

Bernhard et al., "Linear Fresnel Collector Demonstration on the PSA. Partl-Design; Construction and Quality Control", Proceedings of the 14th Solar PACES International Symposium, Las Vegas, Nevada, Mar. 4-7, 2008, 10 pages.

Dey et al., "Operation of a CLFR Research Apparatus", Proceedings of the 38th Annual Conference of the Australian and New Zealand Energy Society, Solar 2000—From Fossils to Photons, Brisbane, Australia, Nov. 28, 2000 through Dec. 1, 2000, pp. 516-527.

Dey, C. J., "Heat Transfer Aspects of an Elevated Linear Absorber", Solar Energy, vol. 76, 2004, pp. 243-249.

Francia, G., "Pilot Plants of Solar Steam Generating Stations", Solar Energy, vol. 12, The Journal of Solar Energy Science and Technology, 1968, pp. 51-64.

Haberle et al., "The Solarmundo Line Focussing Fresnel Collector. Optical and Thermal Performance and Cost Calculations", Available at: <http://www.ise.fraunhofer.de/veroeffentlichungen/nach-jahrgaengen/2002/the-solarmundoline-focussing-fresnel-collector-optical-and-thermal-performance-and-cost-calculations>, Sep. 2002, 11 pages.

Hu et al., "Solar Power Boosting of Fossil Fuelled Power Plants", Proceedings ISES Solar World Congress, Goteborg, Sweden, Jun. 14-19, 2003, 7 pages.

Jance et al., "Natural Convection and Radiation within an Enclosed Inverted Absorber Cavity: Preliminary Experimental Results", ANZSES Annual Conference—From Fossils to Photons, Brisbane, Australia, 2000, 7 pages.

Jance, Michael, "Experimental and Numerical Analysis of combined Convention and Radiation Heat Transfer within a Stratified Trapezoidal Cavity", University of New South Wales, Thesis Project Report, Jun. 2003, 195 pages.

Mills et al., "Compact Linear Fresnel Reflector Solar Thermal Powerplants", Solar Energy, vol. 68, No. 3, Mar. 2000, pp. 263-283.

Mills et al., "Design of a 240 MWe Solar Thermal Power Plant", Present at Eurosun 2004 Conference, Available at <http://www.ausra.com/pdfs/Design240MWsolarthermalpowerplant_Mills_2004>, 2004, 8 pages.

Mills et al., "First Results from Compact Linear Fresnel Reflector Installation", Proceedings Solar 2004, Australian and New Zealand Energy Society, Murdoch, Dec. 2004, 7 pages.

Mills et al., "Multi-tower Line Focus Fresnel Array Project", Journal of Solar Energy Engineering, vol. 128, No. 1, Feb. 2006, pp. 118-120.

Mills et al., "Multi-Tower Line Focus Fresnel Arrays", Proceedings of ISEC 2003: International Solar Energy Conference, Manua Kea Resort, Hawaii Island, Hawaii, USA, Mar. 16-18, 2003, 6 pages.

Mills et al., "Solar Preheating of the Liddell Coal-fired Powerplant", ANZSES Annual Conference 2003, Nov. 26-29, 2003, pp. 600-604.

Mills, D., "Advances in Solar Thermal Electricity Technology", Solar Energy, vol. 76, 2004, pp. 19-31.

Mills, D., "Lower Temperature Approach for Very Large Solar Powerplants", Presented at 11th SolarPaces, Zurich, Switzerland, Sep. 4-6, 2002, 6 pages.

Mills et al., "Advanced Fresnel Reflector Powerplants—Performance and Generating Costs", Proceedings of Solar 97—Australia and New Zealand Solar Energy Society, paper 84, 1997, pp. 1-9.

Mills et al., "Project Proposal for a Compact Linear Fresnel Reflector Solar Thermal Plant in the Hunter Valley", Available at <http://solar1.mech.unsw.edu.au/glm/papers/Mills_projectproposal_newcastle_pdf>, 2002, 6 pages.

Morrison et al., "Water-in-Glass Evacuated Tube Solar Water Heaters", Proceedings of ISES 2001, Solar World Congress, Adelaide, Australia, Nov. 25-30, 2001, pp. 545-550.

Morrison et al., "Solar Thermal Power Systems—Stanwell Power Station Project", ANZSES Annual Conference, Geelong, Australia, 1999, 10 pages.

Nitarski et al., "Combined Radiation and Natural Convection in a Trapezoidal Cavity Absorber: An Experimental Study", Proceedings of the Seventh Australasian Heat and Mass Transfer Conference, James Cook University, Townsville, Jul. 2000, pp. 251-256.

International Search Report and Written Opinion received for PCT Patent Application No. PCT/AU2005/000208, mailed on May 24, 2005, 5 pages.

Pye et al., "Convection Inside the Cavity Receiver of the CLFR Concentrating Solar Power System", 7th Natural Convection Workshop, Sydney, Australia, Jul. 2003, 2 pages.

Pye et al., "Modelling of Cavity Receiver Heat Transfer for the Compact Linear Fresnel Reflector", ISES World Congress, Jun. 14-19, 2003, 8 pages.

Pye et al., "Steam-circuit Model for the Compact Linear Fresnel Reflector Prototype", ANZSES Solar 2004: Life, the Universe and Renewables, Perth, Western Australia, Nov. 30-Dec. 3, 2004, pp. 1-10.

Pye et al., "Transient Modelling of Cavity Receiver Heat Transfer for the Compact Linear Fresnel Reflector", ANZSES Solar 2003, Melbourne, Australia, Nov. 23-29, 2003, pp. 1-9.

Reynolds et al., "A Hydrodynamic Model for a Line-Focus Direct Steam Generation Solar Collector", Proceedings of Solar 2002—Australia and New Zealand Solar Energy Society—Solar Harvest, Newcastle, Australia, 2002, pp. 1-6.

Reynolds et al., "Combined Radiation and Natural Convection in a Trapezoidal Cavity Absorber", Proceedings 7th Australasian Heat Transfer and Mass Transfer Conference, Townsville, Australia, as

(56) References Cited

OTHER PUBLICATIONS posted on <http:/solar1.mech.unsw.edu.au/glm/galm-papers/7AHMTC_reynolds.pdf>, Jun. 2000, 6 pages.
Reynolds et al., "Heat Transfer in a Trapezoidal Cavity Absorber for a Solar Thermal Collector", ANZSES Annual Conference—Renewable Energy Transforming Business, Brisbane, Australia, 2000, pp. 547-555.
Solar Progress, "Solar Progress Renewable Energy for Australasia", Solar Progress, vol. 25, No. 3, Oct. 2004, pp. 1-35.
Di Canio et al., "Line Focus Solar Thermal Central Receiver Research Study: Final Report for Period Apr. 30, 1977-Mar. 31, 1979", FMC Corporation: Santa Clara, CA, U.S. Department of Energy Solar Energy Under Contract DE-AC03-76ET-20426, DOE/ET/20426-1, 316 pages.
Burbidge et al., "Stanwell Solar Thermal Power Project", 10th Symposium on Solar Thermal Concentrating Technologies, Sydney, Australia, 2000, 6 pages.
Reynolds et al., "An Experimental and Computational Study of the Heat Loss Characteristics of a Trapezoidal Cavity Absorber", Proceedings of ISES 2001 Solar World Congress, Adelaide, Australia, Nov. 25-30, 2001, pp. 919-924.
Office Action received for Mexican Patent Application No. MXa2010002251, mailed on Jan. 23, 2013, 5 pages (3 pages of English Translation and 2 pages of Official copy).
Non Final Office Action received for U.S. Appl. No. 12/012,821, mailed on Mar. 7, 2013, 8 pages.
Non Final Office Action received for U.S. Appl. No. 12/012,920, mailed on Apr. 4, 2013, 9 pages.
European Office Action received for European Patent Application No. 08828772.7, mailed on Dec. 29, 2011, 5 pages.
International Search Report received for PCT Patent Application No. PCT/AU2004/000884, mailed on Aug. 31, 2004, 2 pages.
International Search Report received for PCT Patent Application No. PCT/AU2007/000268, mailed on May 3, 2007, 2 pages.
International Search Report received for PCT Patent Application No. PCT/AU2007/001232, mailed on Oct. 15, 2007, 3 pages.
International Search Report and Written Opinion received for PCT Patent Application No. PCT/US2008/007098, mailed on Sep. 26, 2008, 9 pages.
International Search Report and Written Opinion received for PCT Patent Application No. PCT/US2008/066185, mailed on Apr. 8, 2009, 9 pages.
International Search Report and Written Opinion received for PCT Patent Application No. PCT/US2008/007419, mailed on May 6, 2009, 9 pages.
International Search Report and Written Opinion received for PCT Patent Application No. PCT/US2008/010230, mailed on Jun. 25, 2009, 15 pages.
International Search Report and Written Opinion received for PCT Patent Application No. PCT/US2008/010223, mailed on Jun. 30, 2009, 18 pages.
International Preliminary Report on Patentability received for PCT Patent Application No. PCT/US2008/010223, issued on Mar. 2, 2010, 13 pages.
International Preliminary Report on Patentability received for PCT Patent Application No. PCT/US2008/010230, issued on Mar. 2, 2010, 11 pages.
Final Office Action received for U.S. Appl. No. 10/597,966, mailed on Jun. 23, 2009, 9 pages.
Final Office Action received for U.S. Appl. No. 12/012,920, mailed on Jul. 29, 2011, 9 pages.
Non-Final Office Action received for U.S. Appl. No. 10/597,966, mailed on Aug. 5, 2008, 8 pages.
Non-Final Office Action received for U.S. Appl. No. 10/597,966, mailed on Aug. 2, 2010, 11 pages.
Non-Final Office Action received for U.S. Appl. No. 12/012,920, mailed on Feb. 16, 2011, 17 pages.
Notice of Allowance received for U.S. Appl. No. 10/597,966, mailed on Mar. 31, 2011, 9 pages.

ABC Online, "Lake Cargelligo Chosen as Solar Energy Project Trial Site", available online at <http://www.abc.net.au/news/newsitems/200705/s1916027.htm>, May 7, 2007, 1 page.
Abengoa, Solar, "Solutions to Global Climate Change: Parabolic Troughs", available online at <http://www.abengoasolarcom/corp/export/sites/solar/resources/pdf/Sevilia_PV.pdf>, Feb. 25, 2008, 14 pages.
Aberdeen Group, "Effect of High Temperature on Hardened Concrete", 1971, 3 pages.
Allani et al., "$CO_2$ Mitigation Through the Use of Hybrid Solar-Combined Cycles", Proceedings of the Third International Conference on Carbon Dioxide Removal, Cambridge, Energy Covers. Mgmt., vol. 38, 1997, pp. S661-S667.
Allani et al., "Concept Global D'Une Nouvelle Centrale Solaire a Cycle of Combine Dual Fuel", Entropie, vol. 164/165, 1991, pp. 121-122 (partial English Machine Translation).
Allani, Y., "A Global Concept of a New Type of Solar Combined Cycle Duel Fuel Plant", Presented at 6th International Symposium on Solar Thermal Concentrating Technologies, Plataforma Solar de Almeria, Spain, Sep. 28-Oct. 2, 1992, pp. 939-943.
Allani, Yassin, "Etude d'une nouvelle centrale Electro-Thermo-solaire a cycle combine bi-combustible", Journees Internationales de Thermique (JITH 95), vol. 2, 1995, 2 pages, (1 page of English Translation and 1 page of Original Document).
Anonymous, "Cooma Company's $5 Million Grant", Monaro Post, May 9, 2007, 1 page.
ASTM, "Meta-quartzite From the Rainbow Quarries", 2008, 2 pages. (Screen shot).
ASTM International, "Standard Specification for Electroplated Engineering Nickel Coatings", 2008, pp. 1-7.
Bennett et al., "Investigations of an Electrodeposited Tin-Nickel Alloy", Journal of the Electrochemical Society, vol. 123, No. 7, Jul. 1976, pp. 999-1003.
Birnbaum et al., "A Concept for Future Parabolic Trough Based Solar Thermal Power Plants", ICPWS XV, Berlin, Germany, Sep. 8-11, 2008, pp. 1-10.
Bombala Times, "Cooma Project Receives $5 Million in Funding", available online at <http://www.bombalatimes.com.au/news/local/news/General/Cooma-project-receives-5-million-in-funding/267734.aspx>, May 8, 2007, 3 pages.
Bopp et al., "Solare Vorwarmung zur Brennstoffeinsparung in Fossil Befeuerten Kraftwerken", Solarenergie, vol. 48, No. 6, Jun. 1996, pp. 26-32, (6 pages of English Translation and 8 pages of Original Document).
Brosseau et al., "Testing Thermocline Filler Materials and Molten-Salt Heat Transfer Fluids for Thermal Energy Storage Systems Used in Parabolic Trough Solar Power Plants", SAND2004-3207, Jul. 2004, pp. 3-95.
Bruhn et al., "Criteria for the Assessment of Concepts for the Use of Solar Energy in Combine Heat and Power", Proceeding of EuroSun, vol. 96, 1996, pp. 1695-1700.
Bruhn, "Einsatz von Solarenergie in der zentralen Warme-Kraft-Kopplung", HLH Bd, vol. 45, No. 11, Nov. 1994, pp. 573-576, (10 pages of English Translation and 4 pages of Original Document).
Buie et al., "Optical Considerations in line Focus Fresnel Concentrators", Proceedings of the 11th SolarPACES International Symposium on Solar Thermal Concentrating Technologies, Zurich, Switzerland, available online at <http://www.physics.usyd.edu.au/app/solar/publications/index.html>, Sep. 3-6, 2002, 6 pages.
Burley et al., "Proceedings of Solar '94", The 1994 American Solar Energy Society Annual Conference, San Jose, CA, (Table of Contents), Jun. 25-30, 1994, pp. vii-ix.
Buschle et al., "Latent Heat Storage for Process Heat Applications", Available at <http://de.scientificcommons.org/37481048>, 2006, 8 pages.
Carden, P. O., "Energy Corradiation Using the Reversible Ammonia Reaction", Solar Energy, vol. 19, 1977, pp. 365-378.
Carvalho et al., "High-Resolution Transmission Electron Microscopy Study of Discontinuously Precipitated Ni3Sn", ACTA Mater., vol. 48, 2000, pp. 4203-4215.
Choudhury, C et al., "A fresnel strip reflector-concentrator for tubular solar-energy collectors", Applied Energy, Elsevier Science Publish-

(56) References Cited

OTHER PUBLICATIONS ers, GB, vol. 23, No. 2, XP025417777, ISSN: 0306-2619, 001: 10.1016/0306-2619(86)90036-X, Jan. 1, 1986, pp. 143-154.

Copeland et al., "For Water/Steam, Organic Fluid, and Air/Brayton Solar Thermal Collector Receivers", In Comparative Ranking of Thermal Storage Systems, vol. 1, Solar Energy Research Institute, Golden, Colorado, Nov. 1983, 116 pages.

Darnell et al., "A Solar-Fossil Combined Cycle Power Plant", AS/ISES 1980, Proceedings of the 1980 Annual Meeting American Section of the International Solar Energy Society, Inc., Phoenix, Arizona, Jun. 2-6, 1980, pp. 563-567.

Deleon et al., "Solar Technology Application to Enhanced Oil Recovery", Solar Energy Research Institute, U.S. Department of Energy Contact No. EG-77-C-01-4042, Dec. 1979, 110 pages.

Dubberly et al., "Cost and Performance of Thermal Storage Concepts in Solar Thermal Systems, Phase I", In Comparative Ranking of Thermal Storage Systems, vol. II, Solar Energy Research Institute, Golden, Colorado, Nov. 1983, 294 pages.

Eck et al., "Direct Solar Steam in Parabolic Troughs—Simulation of Dynamic Behavior", Presented at the 2007 Parabolic Trough Technology Workshop, Golden, Colorado, available at <http://www.nrel.gov/csp/troughnet/wkshp_2007.html>, Mar. 8-9, 2007, 25 pages.

Eckstock, "Session Descriptions", Proceedings of Eckstock, The Richard Stockton College New Jersey, Pomona, New Jersey, May 31-Jun. 2, 2006, pp. 1-55.

Electrical News, "Quarterly Supplement for Electrical Engineers", Electrical News, vol. 15, Feb. 2008, pp. 1-12.

Elsaket, Gamal, "Simulating the Integrated Solar Combined Cycle for Power Plants Application in Libya", Thesis for G. Elsaket for Cranfield University, Sep. 2007, 116 pages.

EPRI, "Solar Augmented Steam Cycles for Coal Plants", Electric Power Research Institute, Oct. 2008, 2 pages.

European Office Action received for European Patent Application No. 08828772.7, mailed on Mar. 25, 2013, 7 pages.

Office Action received for Mexican Patent Application No. MX/a/2010/002250, mailed on Apr. 1, 2013, 6 pages (3 pages of English Translation and 3 pages of Official copy).

Office Action received for Mexican Patent Application No. MX/a/2010/002250, mailed on Aug. 28, 2013, 4 pages (1 page of English Translation and 3 pages of Official copy).

Non-Final Office Action received for U.S. Appl. No. 12/012,829, mailed on Jun. 28, 2013, 15 pages.

Final Office Action received for U.S. Appl. No. 12/012,821, mailed on Oct. 16, 2013, 4 pages.

* cited by examiner

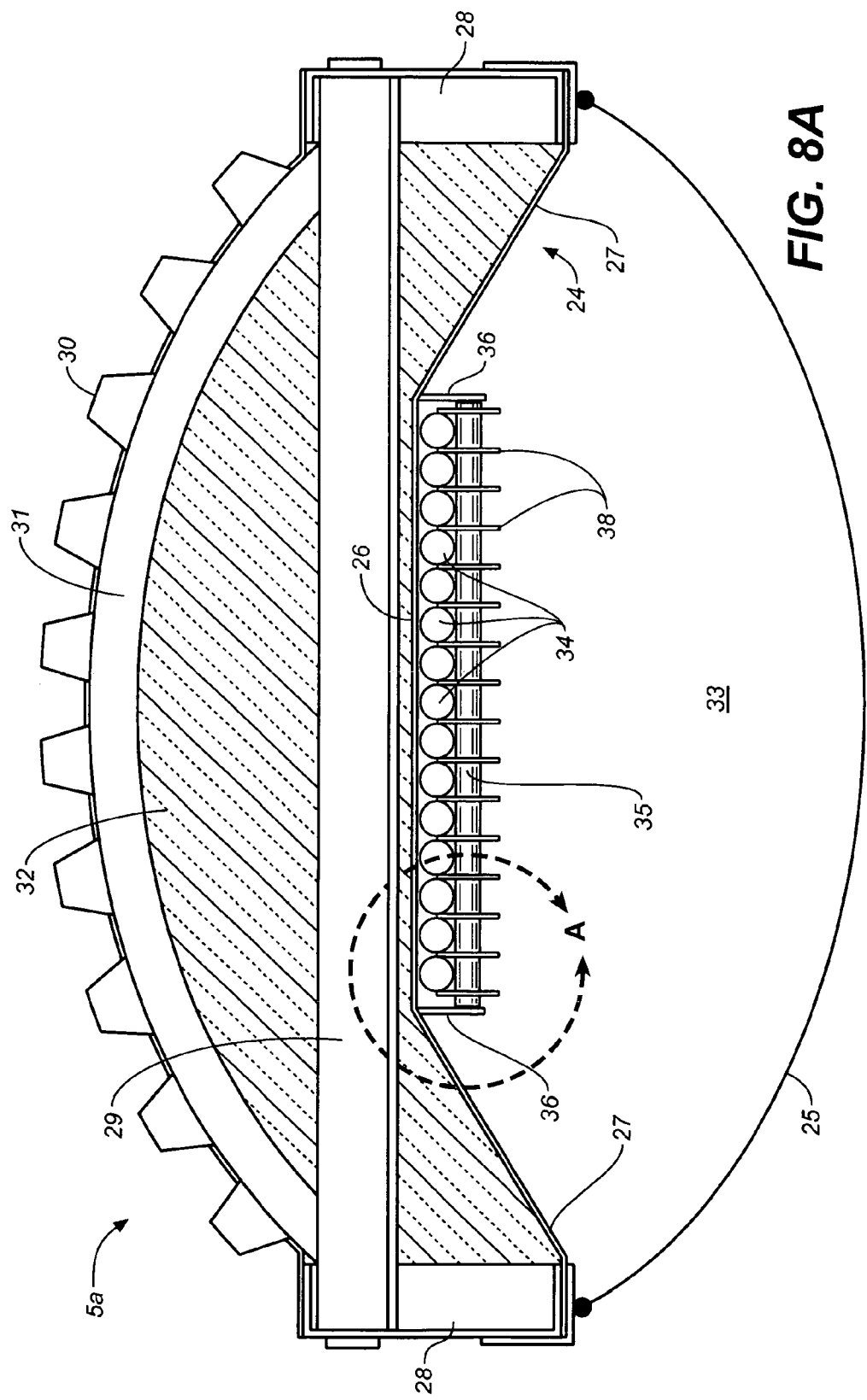

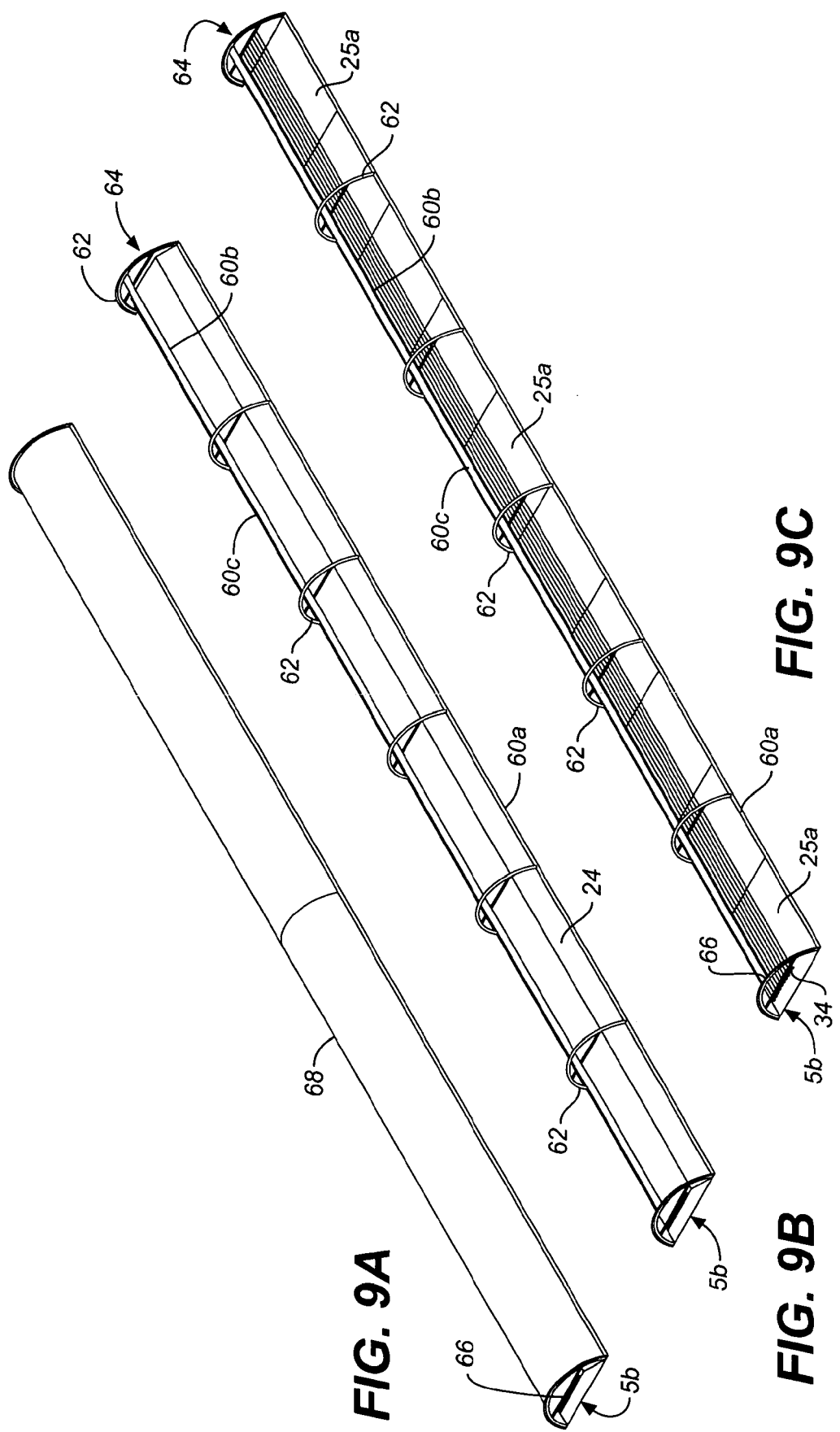

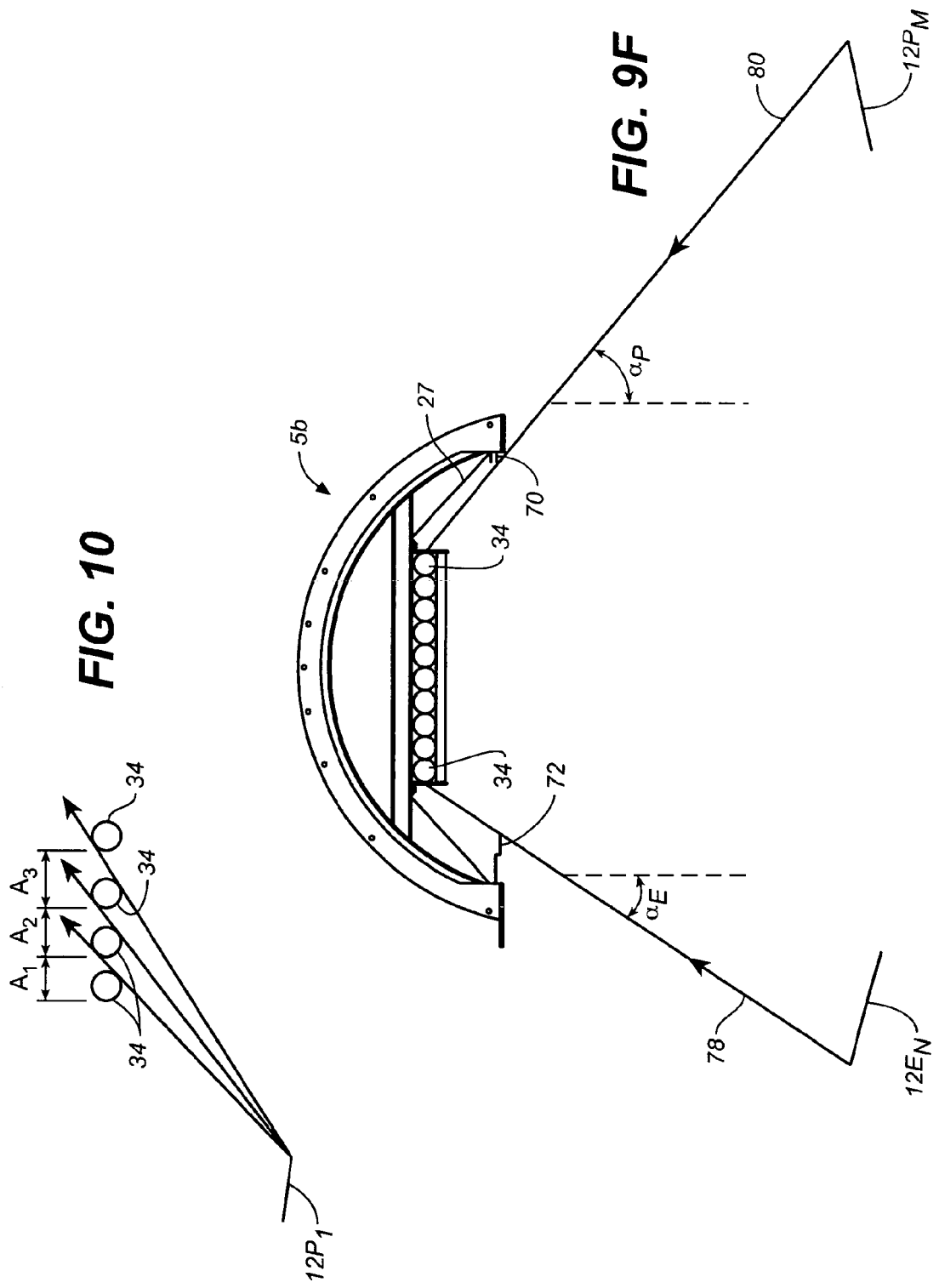

LINEAR FRESNEL SOLAR ARRAYS

CROSS-REFERENCE TO RELATED APPLICATIONS

This application is a National Phase filing under 35 U.S.C. §371 of International Application No. PCT/US2008/010230, filed on Aug. 27, 2008, which claims the benefit of priority to U.S. Provisional Application Ser. No. 61/007,926 filed Aug. 27, 2007, entitled "Linear Fresnel Solar Arrays," which is incorporated by reference herein in its entirety. This application also claims the benefit of priority to U.S. patent application Ser. No. 12/012,920 filed Feb. 5, 2008, entitled "Linear Fresnel Solar Arrays and Components Therefor," U.S. patent application Ser. No. 12/012,829 filed Feb. 5, 2008, entitled "Linear Fresnel Solar Arrays and Receivers Therefor," and U.S. patent application Ser. No. 12/012,821 filed Feb. 5, 2008, entitled "Linear Fresnel Solar Arrays and Drives Therefor," each of which is incorporated by reference herein in its entirety.

BACKGROUND OF THE INVENTION

Solar energy collector systems of the type referred to as Linear Fresnel Reflector ("LFR") systems are relatively well known and are constituted by a field of linear reflectors that are arrayed in parallel side-by-side rows and are oriented to reflect incident solar radiation to a common elevated receiver. The receiver is illuminated by the reflected radiation, for energy exchange, and the receiver typically extends parallel to the rows of reflectors. Also, the receiver normally (but not necessarily) is positioned between two adjacent fields of reflectors; and n spaced-apart receivers may be illuminated by reflections from (n+1) or, alternatively, (n−1) reflector fields, in some circumstances with any one receiver being illuminated by reflected radiation from two adjacent reflector fields.

In most known LFR system implementations the receiver or receivers and the respective rows of reflectors are positioned to extend linearly in a north-south direction, with the reflector fields symmetrically disposed around the receivers and the reflectors pivotally mounted and driven through an angle approaching 90° to track east-west motion (i.e., apparent motion) of the sun during successive diurnal periods. This configuration requires that adjacent rows of reflectors be spaced-apart in order to avoid shading or blocking of one reflector by another and, thus, in order to optimise reflection of incident radiation. This limits ground utilization to approximately 70% and diminishes system performance due to exacerbated spillage at the receiver of radiation from distant reflectors.

As an alternative approach, a 1979 project design study (Ref Di Canio et al; Final Report 1977-79 DOE/ET/20426-1) proposed an east-west-extending LFR system. LFR systems having north-south orientations have typically been expected to outperform LFR systems having east-west orientations at most latitudes, however.

SUMMARY OF THE INVENTION

Disclosed herein are examples and variations of solar energy collector systems comprising an elevated linear receiver and first and second reflector fields located on opposite sides of, and arranged and driven to reflect solar radiation to, the receiver. Also disclosed herein are examples and variations of receivers and reflectors that may, in some variations, be utilized in the disclosed solar energy collector systems.

In a first aspect, a solar energy collector system comprises an elevated linear receiver extending generally in an east-west direction, a polar reflector field located on the polar side of the receiver, and an equatorial reflector field located on the equatorial side of the receiver. Each reflector field comprises reflectors positioned in one or more parallel side-by-side rows which extend generally in the east-west direction. The reflectors in each field are arranged to reflect incident solar radiation to the receiver during diurnal east-west motion of the sun and pivotally driven to maintain reflection of the incident solar radiation to the receiver during cyclic diurnal north-south motion of the sun. The polar reflector field comprises more reflector rows than the equatorial reflector field.

In a second aspect, another solar energy collector system comprises an elevated linear receiver extending generally in an east-west direction, a polar reflector field located on the polar side of the receiver, and an equatorial reflector field located on the equatorial side of the receiver. Each reflector field comprises reflectors positioned in one or more parallel side-by-side rows which extend generally in the east-west direction. The reflectors in each field are arranged to reflect incident solar radiation to the receiver during diurnal east-west motion of the sun and pivotally driven to maintain reflection of the incident solar radiation to the receiver during cyclic diurnal north-south motion of the sun. The reflectors in one or more outer rows of the equatorial reflector field have focal lengths greater than their respective distances to a solar radiation absorber in the receiver.

In a third aspect, another solar energy collector system comprises an elevated linear receiver extending generally in an east-west direction, a polar reflector field located on the polar side of the receiver, and an equatorial reflector field located on the equatorial side of the receiver. Each reflector field comprises reflectors positioned in one or more parallel side-by-side rows which extend generally in the east-west direction. The reflectors in each field are arranged to reflect incident solar radiation to the receiver during diurnal east-west motion of the sun and pivotally driven to maintain reflection of the incident solar radiation to the receiver during cyclic diurnal north-south motion of the sun. The receiver is tilted in the direction of the polar reflector field.

In a fourth aspect, a solar energy collector system comprises an elevated linear receiver comprising a solar radiation absorber and a window substantially transparent to solar radiation, and first and second reflector fields located on opposite sides of the receiver. Each reflector field comprises reflectors positioned in one or more parallel side-by-side rows which extend generally parallel to the receiver. The reflectors in each field are arranged and driven to maintain reflection of incident solar radiation to the absorber through the window during diurnal motion of the sun. The window comprises an anti-reflection coating having a maximum transmission of solar radiation at an angle of incidence differing from perpendicular incidence and selected to maximize an annualized solar radiation collection efficiency of the solar energy collector system.

These and other embodiments, features and advantages of the present invention will become more apparent to those skilled in the art when taken with reference to the following more detailed description of the invention in conjunction with the accompanying drawings that are first briefly described.

BRIEF DESCRIPTION OF THE DRAWINGS

FIGS. 8A and 8B show schematic representations of an example receiver structure, with FIG. 8B showing a portion of the receiver structure which is encircled by circle A in FIG. 8A.

FIGS. 9A-9F show schematic representations of another example receiver structure, with FIGS. 9A-9C showing partial perspective views, FIG. 9D showing a transverse cross-sectional view, FIG. 9E showing detail of a window structure, and FIG. 9F illustrating the receiver structure's asymmetric aperture.

FIG. 10 shows a schematic representation of an example configuration of spacings between absorber tubes in a receiver.

DETAILED DESCRIPTION OF THE INVENTION

Figure 1:
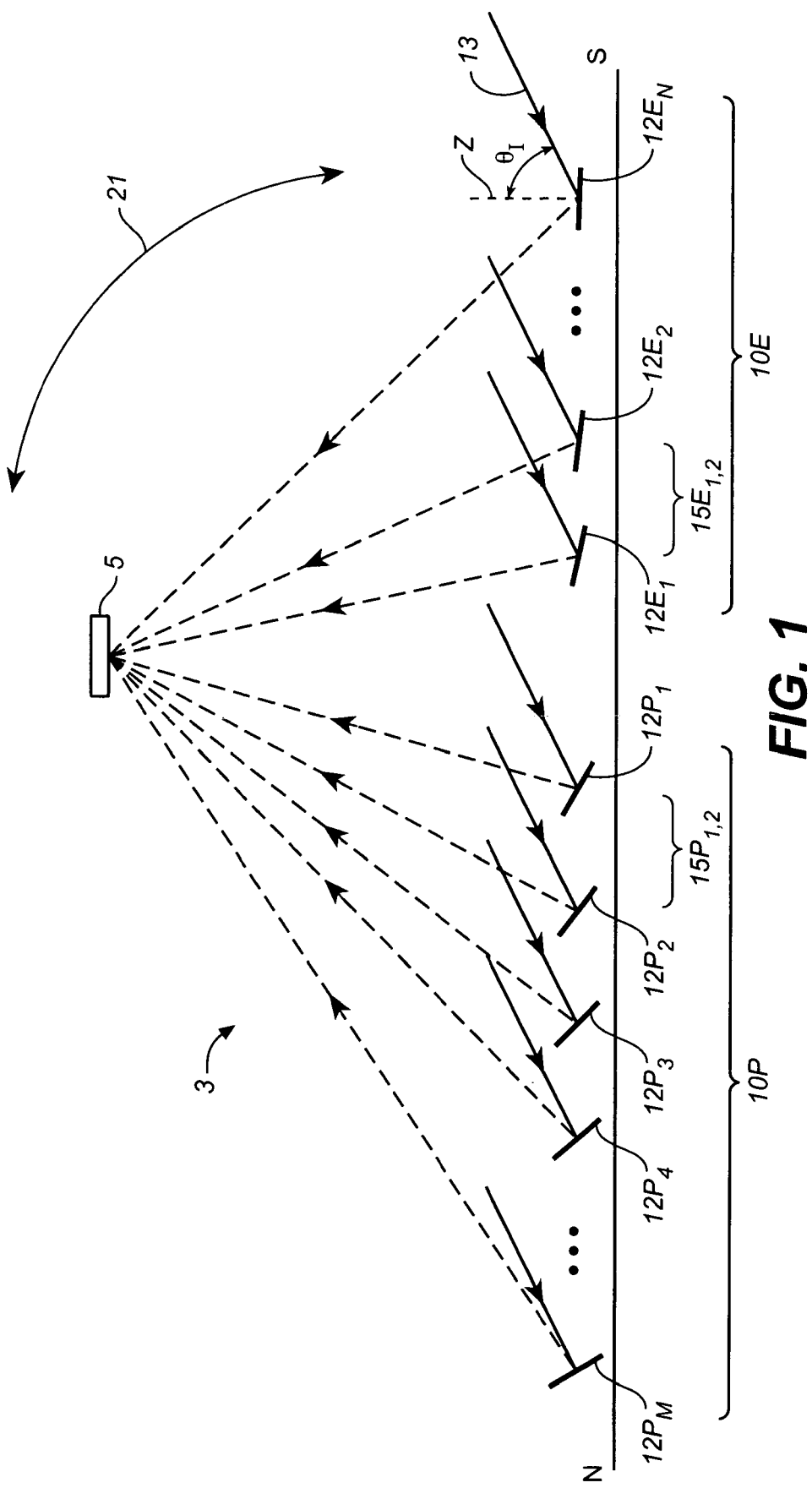
FIG. 1 shows schematically a portion of a Linear Fresnel Reflector ("LFR") solar collector system in accordance with one variation of the present invention, the system having a single receiver and reflector fields located to the north and south of the receiver.

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

In addition, it must be noted that, as used in this specification and the appended claims, the singular forms "a," "an," and "the" include plural referents unless the context clearly indicates otherwise. Also, the term "parallel" is intended to mean "substantially parallel" and to encompass minor deviations from parallel geometries rather than to require that parallel rows of reflectors, for example, or any other parallel arrangements described herein be exactly parallel. The phrase "generally in an east-west direction" as used herein is meant to indicate a direction orthogonal to the earth's rotation axis within a tolerance of +/−45°. For example, in referring to a row of reflectors extending generally in an east-west direction, it is meant that the reflector row lies orthogonal to the earth's rotation axis within a tolerance of +/−45°.

Disclosed herein are examples and variations of asymmetric east-west LFR solar arrays, receivers for receiving and capturing solar radiation collected by LFR solar arrays, and reflectors that may be used in LFR solar arrays. For convenience and clarity, asymmetric east-west LFR arrays, receivers, and reflectors are described in detail below in three separately labelled sections. This organization of the detailed description is not meant to be limiting, however. Any suitable receiver or reflector, disclosed herein, known to one of ordinary skill in the art, or later developed, may be used in the asymmetric arrays disclosed herein. Further, receivers and reflectors disclosed herein may be used, where suitable, in other east-west LFR solar arrays known to one of ordinary skill in the art or later developed, as well as in north-south LFR solar arrays known to one of ordinary skill in the art or later developed.

Asymmetric East-West LFR Arrays

An LFR solar array in which a receiver and rows of reflectors that are oriented generally in an east-west direction may have an asymmetric configuration as a result, for example, of asymmetric (i.e., differing) numbers of rows of reflectors on the polar and equatorial sides of the receiver and/or as a result of asymmetric spacing between rows on opposite sides of the receiver. As explained below, in some variations such asymmetries may improve the performance of the asymmetric east-west array compared to symmetric east-west LFR arrays or to north-south LFR arrays. Asymmetric numbers of rows, asymmetric row spacing, and examples of asymmetric east-west LFR configuration are described next in three subsections.

Asymmetric Numbers of Rows

Figure 2:
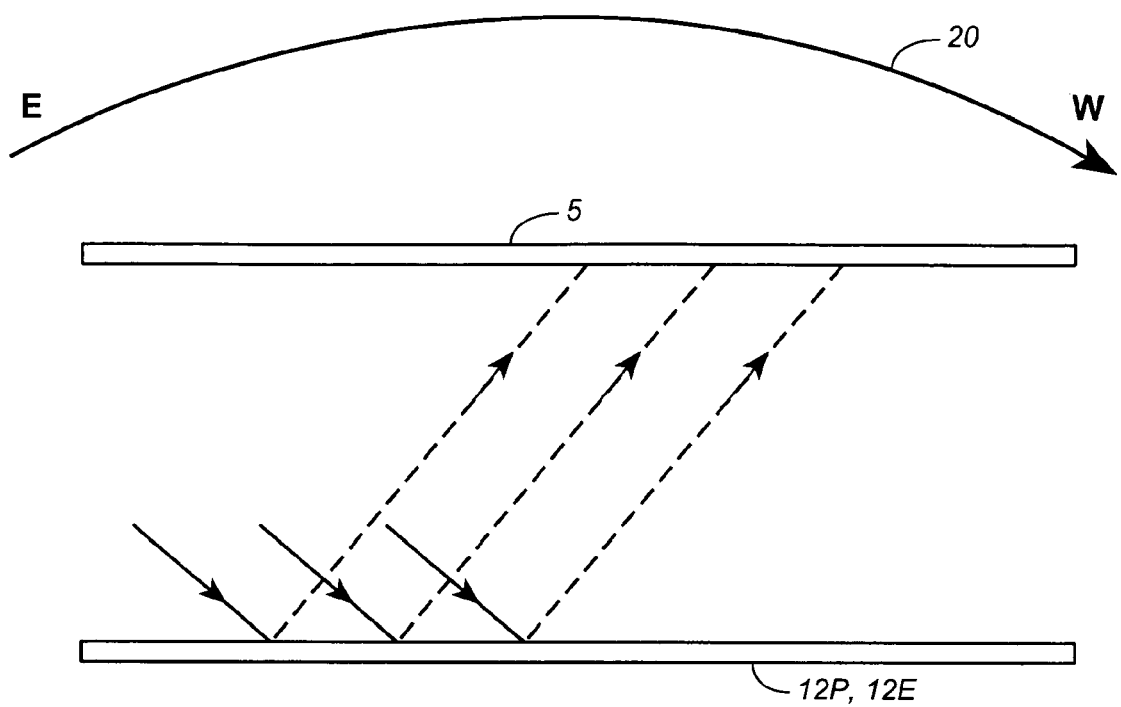
FIG. 2 shows a schematic representation of the LFR system of FIG. 1 as viewed in the direction of Arrow 3 as shown in FIG. 1.

Referring to FIGS. 1 and 2, an example east-west LFR solar array comprises an elevated receiver 5 extending generally in an east-west direction and positioned between two ground level reflector fields 10P and 10E. Reflector field 10P is located to the polar side of the receiver (i.e., to the northern side N in the case of a northern hemisphere system) and reflector field 10E is located to the equatorial side of the receiver (i.e., to the southern side S in the case of a northern hemisphere system). Reflector fields 10P and 10E comprise, respectively, parallel side-by-side reflector rows $12P_1$-$12P_M$ and parallel side-by-side reflector rows $12E_1$-$12E_N$, which also extend in the generally east-west direction. The polar reflector rows are spaced apart by spacings $15P_{x,x+1}$ where x identifies a particular row. As an example, spacing $15P_{1,2}$ is identified in the figure. Similarly, the equatorial rows are spaced apart by spacings $15E_{x,x+1}$, with $15E_{1,2}$ identified in the figure.

The reflectors in fields 10P and 10E are arranged and positioned to reflect incident solar radiation (e.g., ray 13) to the receiver 5 during diurnal east-west motion of the sun in the direction indicated by arrow 20 (FIG. 2). Additionally, the reflectors are pivotally driven to maintain reflection of the incident solar radiation to the receiver 5 during cyclic diurnal north-south motion of the sun in the (inclining and declining) directions indicated by arrow 21 (FIG. 1).

The inventors have discovered that in some cases the best annualized solar radiation collection efficiency for an east-west LFR array having a total number of substantially identical reflector rows M+N occurs for configurations in which the total number of rows M in the polar field 10P is greater than the total number of rows N in the equatorial field 10E. The inventors presently believe that this occurs because the reflectors in the polar field 10P can in some cases provide a significantly greater effective reflector area and produce better focused images at the receiver than do reflectors in the equatorial field 10E placed at similar (or even at shorter) distances from the receiver.

Figure 3:
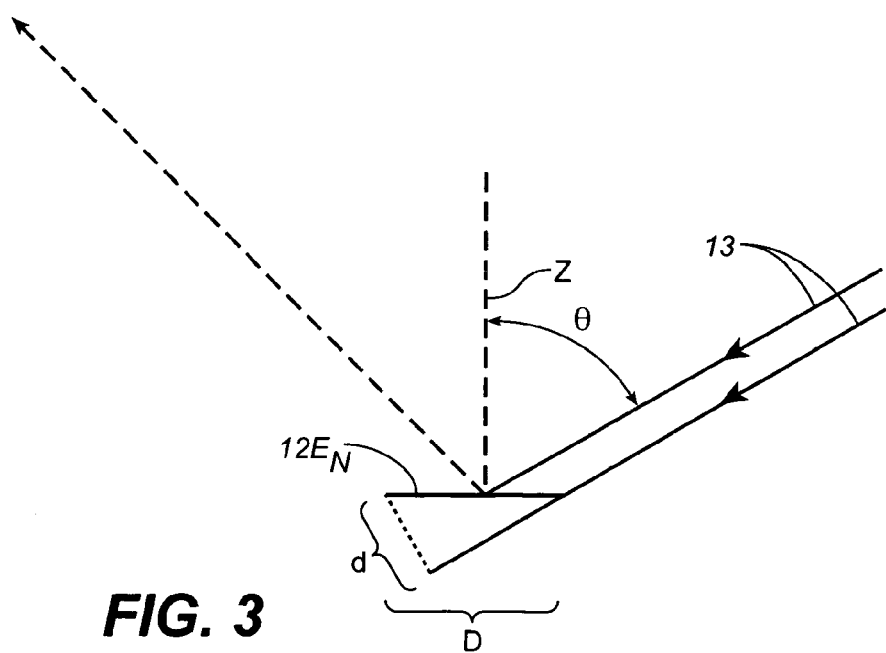
FIG. 3 illustrates the relationship between the effective area of a reflector, the width of the reflector, and the angle of incidence of solar radiation incident on the reflector.

Referring to FIGS. 1 and 3, the effective reflector width d provided by a reflector (e.g., reflector 12$E_N$) having a width D and oriented at an angle of incidence $\theta$ between incident rays 13 and an axis Z perpendicular to the reflector is $d=D \cos(\theta)$. Thus, a reflector's effective area decreases as the angle of incidence increases. In addition, optical aberrations such as astigmatism, for example, increase as the angle of incidence increases. Such optical aberrations blur the focus of the solar radiation reflected by a reflector to the receiver and thus decrease collection efficiency.

The diurnal sun moves through an angle less than 90° in the north-south direction, as compared with an angle approaching 180° in the east-west direction. Hence, in contrast to north-south LFR arrays, the total pivotal movement imparted to each reflector in reflector fields 10P and 10E (FIG. 1) is less than 45° during each diurnal period. As a consequence, the angles of incidence for reflectors in the polar field 10P are always greater than those for the reflectors in equatorial field 10E. The inventors have recognized that, as a further consequence, a reflector in the polar field will have greater effective area and produce better focus at the receiver than an identical reflector in the equatorial field positioned the same distance from the receiver. The inventors have discovered that these effects can be exploited to increase light collection efficiency in an east-west LFR solar array by putting more reflector rows in the polar field than in the equatorial field.

Improvements in collection efficiency resulting from putting more of a total number of rows of reflectors on the polar rather than on the equatorial side of a receiver in an east-west LFR array may be offset, to some extent, by the resulting increase in the number of reflectors at longer distances from the receiver and by the possibility of closely spacing equatorial rows (described below in the asymmetric spacing section). As the distance between a reflector and the receiver increases, the required focal length for the reflector and thus the size of the focused image at the receiver also increases. This can reduce collection efficiency if the focused spot is bigger than the receiver, for example. In addition, the angle of incidence on a horizontally oriented receiver surface (e.g., a transparent window) made by rays of light reflected by one of the reflectors to the receiver increases as the distance between the reflector and the receiver increases. This can increase the loss of collected light due to reflection at the receiver. Consequently, the optimal number of rows of reflectors in the equatorial field is typically, though not necessarily, greater than zero.

Figure 4:
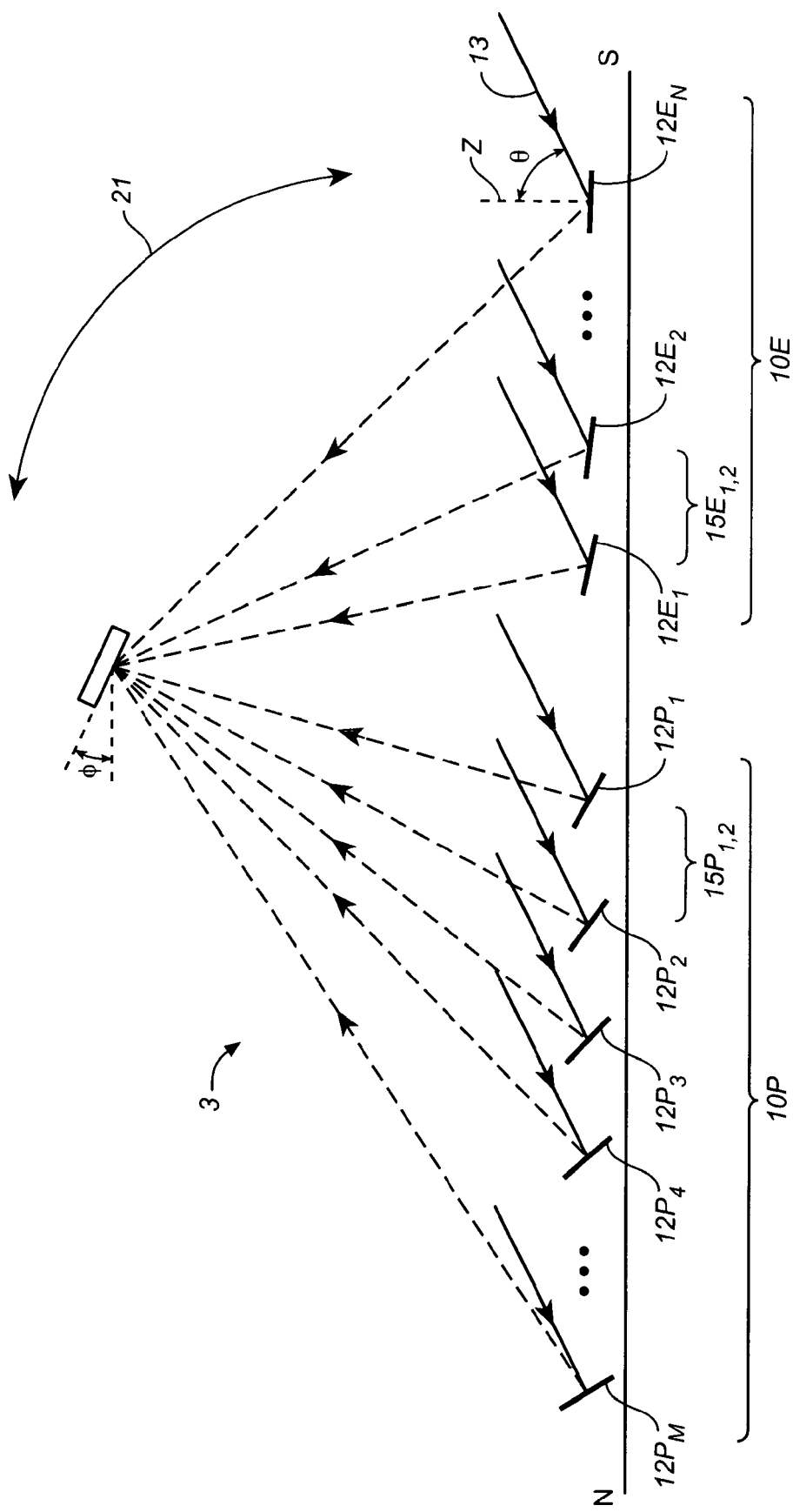
FIG. 4 shows schematically a portion of a LFR system as in FIG. 1 but with the receiver tilted from the horizontal in the direction of the polar reflector field.

Improvements in collection efficiency resulting from putting more of a total number of rows of reflectors on the polar rather than on the equatorial side of a receiver in an east-west LFR array may also be affected by the height at which the receiver is positioned, the orientation (tilt) of the receiver from horizontal, and the latitude (angular distance north or south from the equator) at which the array is located. Generally, the resulting improvements in collection efficiency are expected to increase with latitude and to be more pronounced for shorter than for taller receivers. Collection efficiency can be further increased by tilting the receiver by an angle $\phi$ (FIG. 4) from the horizontal to face the polar reflector field. Tilting the receiver in the polar direction may further increase the optimal number of rows of reflectors in the polar field.

Asymmetric Row Spacings

Referring again to FIG. 1, the inventors have additionally recognized that, as a consequence of the generally east-west orientation of the array, the reflectors in the equatorial reflector field 10E will at all times be disposed at an angle to the horizontal that is substantially more acute than that of the reflectors in polar reflector field 10P. Hence, the potential for shading of reflectors in equatorial field 10E will be small relative to that applicable to the reflectors in polar filed 10P.

This permits closer spacing of the equatorial rows than of the polar rows and thus results in a reduction in the total field area relative to that required for an array in which reflector rows are arranged with symmetric spacing around a receiver, as in typical north-south LFR systems. Also, because of the close-to-horizontal disposition of the reflectors in the equatorial field 10E and the close-packing of reflector rows that it permits, equatorial rows of reflectors can be located closer to the receiver than corresponding rows in a north-south LFR array or than corresponding rows in the polar field 10P, thus decreasing focused image size and reducing radiation spillage at the receiver. The inventors have discovered that these effects can be exploited to increase annualized solar radiation collection efficiency in an east-west LFR solar array by asymmetrically spacing the rows of reflectors on opposite sides of the receiver.

Rows on opposite side of the receiver may in some variations be advantageously asymmetrically spaced, for example, by maintaining constant polar row spacings 15$P_{x,x+1}$ and constant equatorial 15$E_{x,x+1}$, with 15$P_{x,x+1}$>15$E_{x,x+1}$; by maintaining a constant equatorial spacing 15$E_{x,x+1}$ that is smaller than all polar spacings 15$P_{x,x+1}$, with polar spacings 15$P_{x,x+1}$ increasing with distance from the receiver; or by having polar 15$P_{x,x+1}$ and equatorial row spacings 15$E_{x,x+1}$, each increase with distance from the receiver with equatorial row spacings 15$E_{x,x+1}$, smaller than corresponding (i.e., between corresponding row numbers) polar rows spacings 15$P_{x,x+1}$. More generally, asymmetric row spacing as used herein is intended to include all variations in which some or all corresponding rows on opposite sides of a receiver are not symmetrically spaced. Asymmetric spacing may, in some variations, result in some or all of the equatorial rows being positioned closer to the receiver than corresponding polar rows.

Improvements in collection efficiency resulting from asymmetrically spacing the rows of reflectors on opposite sides of the receiver may be affected by the height at which the receiver is positioned, the orientation (tilt) of the receiver from horizontal, and the latitude (angular distance north or south from the equator) at which the array is located. Generally, the resulting improvements in collection efficiency are expected to increase with latitude and to be more pronounced for shorter than for taller receivers.

The east-west LFR arrays disclosed herein in which reflector rows on opposite sides of a receiver are asymmetrically spaced as described above may, in some variations, achieve reflector to ground area ratios greater than about 70%, greater than about 75%, or greater than about 80%.

Asymmetric row spacing is further described in International Patent Application Serial No. PCT/AU2007/001232, titled "Energy Collection System Having East-West Extending Linear Reflectors," filed 27 Aug. 2007, assigned to Solar Heat and Power Pty Ltd., for which David Mills and Peter Le Lievre are inventors; incorporated herein by reference in its entirety.

Example Array Configurations

Figure 5:
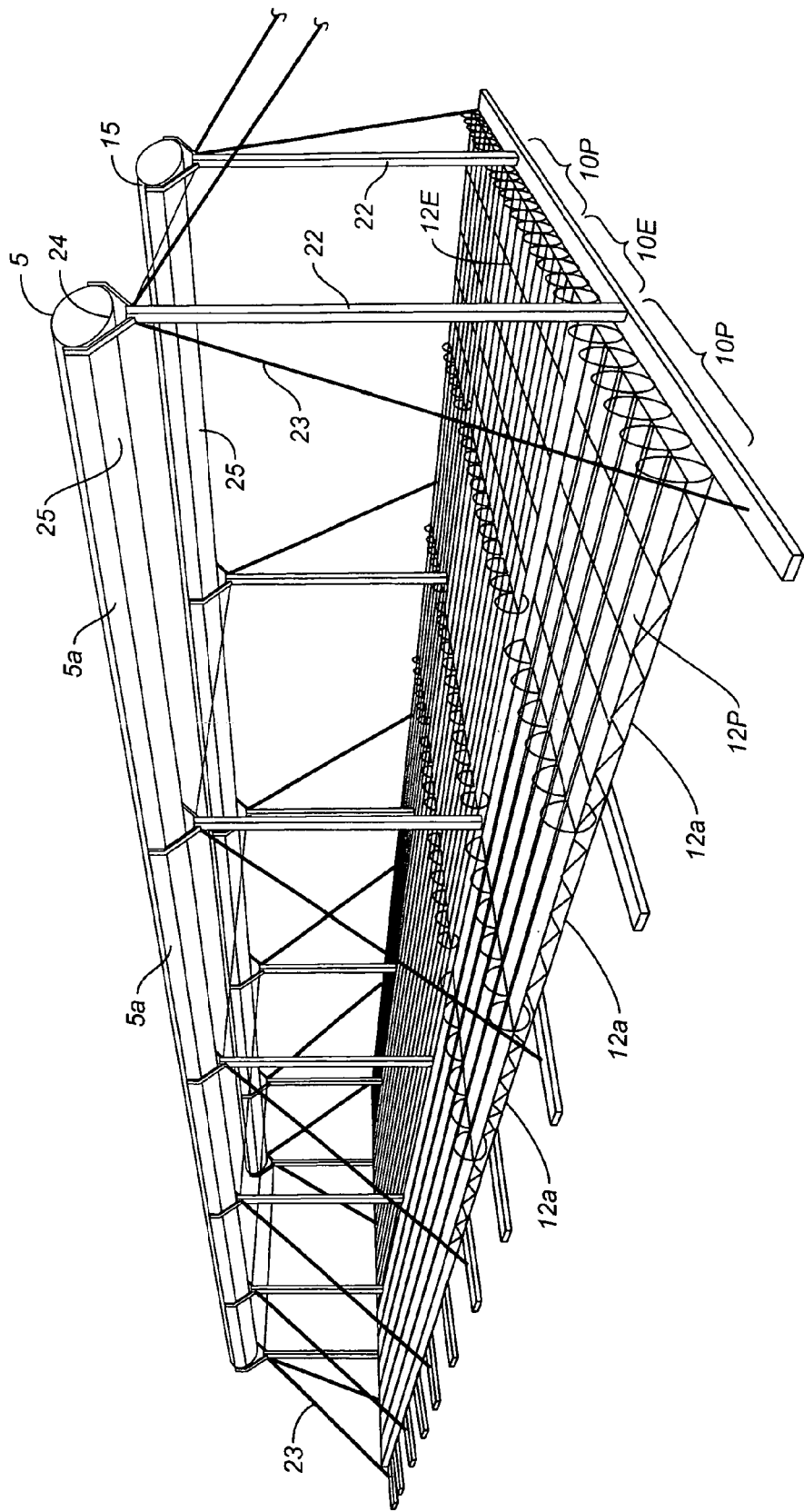
FIG. 5 shows a more detailed representation of an example LFR system of the type shown in the previous figures but with two substantially parallel receivers.

Referring now to FIG. 5, another example LFR system of the type shown in the previous figures comprises polar 10P and equatorial 10E reflector fields comprising reflectors 12a aligned (and, e.g., interconnected) in parallel rows 12P, 12E that extend generally in an east-west direction. In addition, this example LFR system comprises two parallel receivers 5, each of which is constituted by aligned (and, e.g., interconnected) receiver structures 5a. Reflectors 12a may be driven collectively or regionally, as rows or individually, to track motion of the sun. Reflectors 12a are oriented to reflect incident radiation to respective ones of the receivers 5 in the manner described with reference to the previous figures.

A complete LFR system might occupy a ground area of, for example, about $5 \times 10$ m$^2$ to about $25 \times 10^6$ m$^2$. The system as illustrated in FIG. 5 may be considered as a portion only of a larger LFR system having a plurality of receivers arranged side-by-side and parallel to each other.

Reflectors 12a may be any suitable reflector described herein (e.g., below in the reflectors section), known to one or ordinary skill in the art, or later developed. Suitable reflectors may include, for example, those disclosed in International Patent Applications numbered PCT/AU2004/000883 and PCT/AU2004/000884, both of which are incorporated herein by reference in their entirety.

Suitable reflectors may have, for example, circular or parabolic cross sections providing approximately a line focus, and may have focal lengths of, for example, about 10 to about 25 meters (i.e., radii of curvature of about 20 meters to about 50 meters for reflectors with circular cross section). In some variations, the focal length of a reflector approximately matches the distance from the reflector to the receiver. In other variations, the focal length of a reflector is about 5% to about 20%, or from about 5% to about 15%, or from about 10% to about 15% greater than the distance from the reflector to the receiver. The inventors have discovered that the solar radiation collection efficiency of an east-west LFR solar array can be improved by using reflectors having such focal lengths greater than the distance to the receiver, particularly for the equatorial rows farthest from the receiver. The collection efficiency of outer equatorial rows may be improved in this manner by, for example more than 5%.

Reflectors 12a may have, for example, lengths of about 10 meters to about 20 meters and widths of about 1 meter to about 3 meters. Any suitable reflector dimensions may be used, however. In one variation, reflectors 12a have lengths of about 12 meters and widths of about 2 meters. In another variation, reflectors 12a have lengths of about 16 meters and widths of about 2 meters.

Each row 12P, 12E of reflectors and each receiver 5 may have, for example, an overall length of about 200 to about 600 meters. Any suitable row and/or receiver length may be used, however. In some variations, groups of adjacent reflectors in a row are interconnected to form row segments driven collectively by one or more motors. Such a row segment may comprise, for example, 2, 4, 6, or any suitable number of reflectors.

Receivers 5 may be any suitable receiver described herein (e.g., below in the receiver section), known to one or ordinary skill in the art, or later developed. Suitable receivers may include, for example, those disclosed in International Patent Application numbered PCT/AU2005/000208, which is incorporated herein by reference in its entirety. Receivers 5 may be, for example photovoltaic receivers which absorb incident solar radiation and convert it to electricity, or thermal receivers which absorb incident solar radiation to heat a working or heat exchange fluid passing through the receiver. Receivers 5 may have a horizontal orientation (e.g., a horizontally oriented aperture and/ or absorber) as shown in FIGS. 1 and 5, for example, or a tilted orientation (e.g., an aperture and/or absorber tilted toward either the polar or the equatorial reflector field) as shown, for example, in FIG. 4. Suitable receivers may have, for example, absorbers (e.g., groups of tubes or flat plates) having a width (i.e., perpendicular to the long axis of the receiver) of about 0.3 meters to about 1 meter, or any other suitable width.

Receivers 5 may optionally be formed from interconnected receiver structures 5a as shown, for example, in FIG. 5. Receiver structures 5a may have lengths of, for example, about 8 meters to about 20 meters and overall widths of about 0.5 meters to about 1.5 meters.

Figure 6:
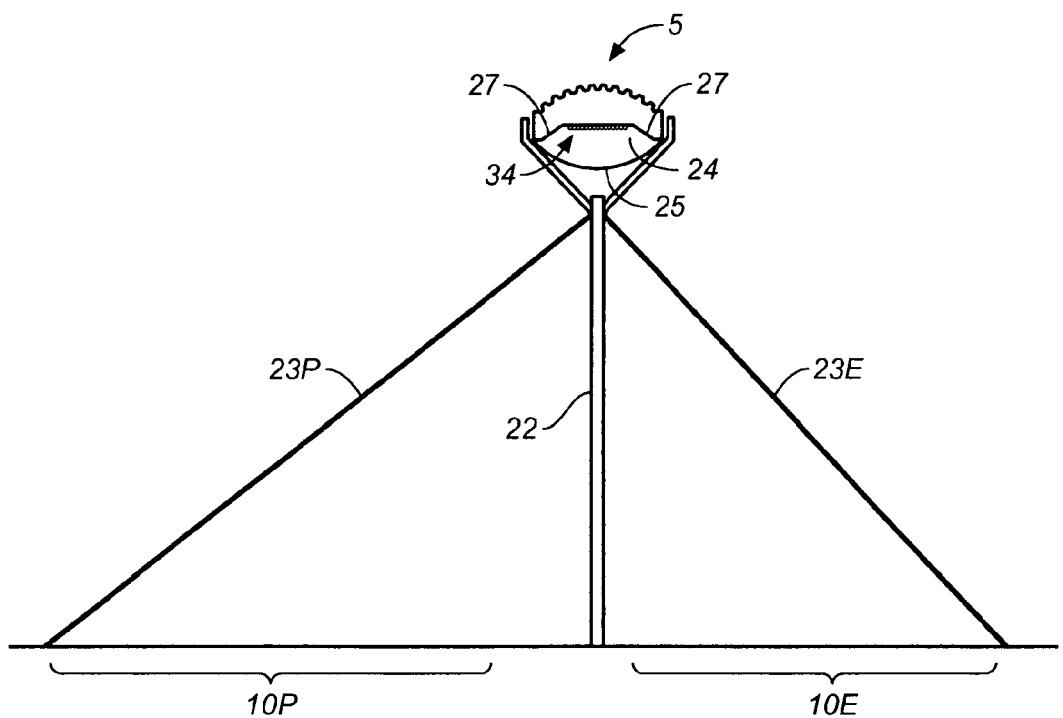
FIG. 6 shows a schematic representation of an example receiver structure supported by a stanchion and stabilized by asymmetric guy wires.

Receivers 5 might typically be spaced apart by 20 to 35 meters, for example, but any suitable receiver spacing may be used. The receivers may be supported, for example, with their absorbers positioned at a height of about 10 meters to about 20 meters above the reflectors by, for example, stanchions 22 as shown in FIG. 5 and FIG. 6. Such stanchions may be stayed by ground-anchored guy wires 23 as shown in FIG. 5, for example. The inventors have discovered that the use of asymmetric guy wires (i.e., guy wires of at least two different lengths) such as guys wires 23P, 23E shown in FIG. 6, for example, may advantageously stabilize stanchion 22 and receiver 15 against oscillations. Such stabilization results from the different length guy wires providing different resonance frequencies to the stanchion/receiver structure. The different resonances couple to and damp each other.

Although the example array depicted in FIG. 5 has equal numbers (i.e., 6) of reflector rows in each polar 10P and equatorial 10E reflector field, other variations may include different numbers of rows in the polar and equatorial reflector fields and may include more or fewer than the 12 total rows per receiver shown. In one example, each receiver has 10 associated rows of reflectors, with 6 rows in the polar field and 4 rows in the equatorial field. In another example, each receiver has 10 associated rows, with 7 rows in the polar field and 3 rows in the equatorial field. In another example, each receiver has 12 associated rows, with 8 rows in the polar field and 4 rows in the equatorial field. In another example, each receiver has 14 associated rows, with 9 rows in the polar field and 5 rows in the equatorial field. In yet another example, each receiver has 14 associated rows, with 10 rows in the polar field and 4 rows in the equatorial field. Generally, any suitable total number of rows and any suitable distribution of the rows between polar and equatorial fields may be used.

Although the rows of reflectors in the example array depicted in FIG. 5 are spaced at uniform intervals in the polar 10P and equatorial fields 10E, in other variations the spacings may be asymmetric in any of the manners described above. Generally, any suitable combination of asymmetric numbers of rows in polar and equatorial reflector fields may be used in combination with any suitable asymmetric row spacing. In addition, any suitable asymmetric number of rows in polar and equatorial reflector fields may be used with symmetric row spacings. Also, any suitable symmetric (i.e., equal) number of rows in polar and equatorial reflector fields may be used with any suitable asymmetric row spacing.

As noted above, in some variations tilting the receiver toward the polar reflector field further increases solar radiation collection efficiency. In some variations, the receiver is tilted toward the polar field at, for example, an angle to the horizontal of about 5° to about 35°, of about 10° to about 30°, of about 15° to about 35°, or about 15° to about 20°.

Figure 7:
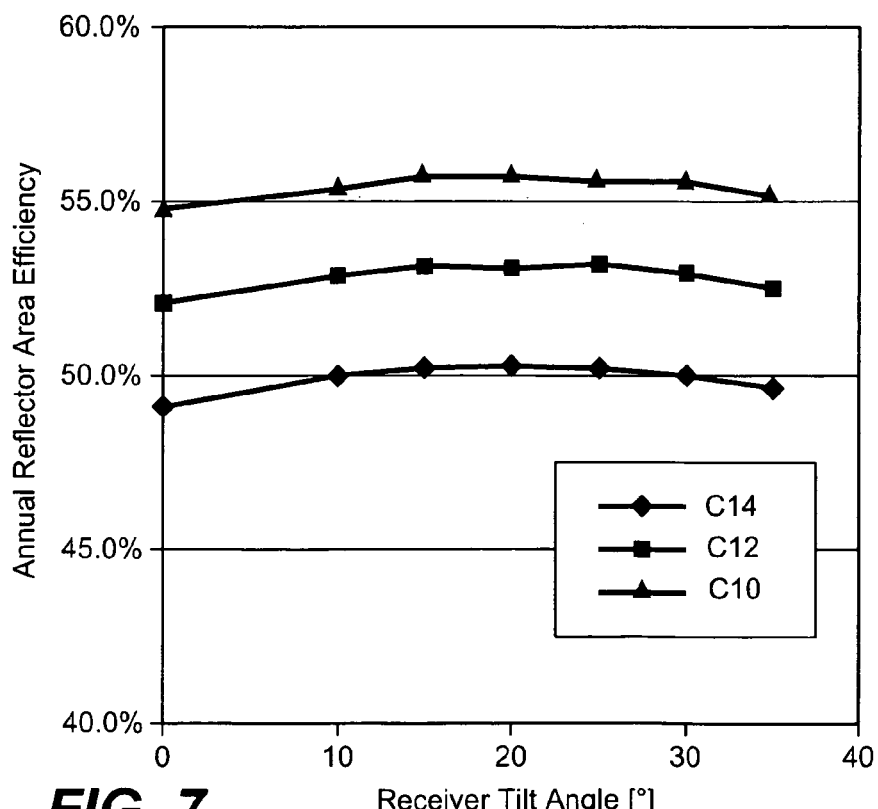
FIG. 7 shows plots of annualized reflector area efficiency versus receiver tilt angle for three east-west LFR array configurations.

FIG. 7 shows three plots of annualized solar radiation collection efficiency versus receiver tilt angle generated with a ray-tracing calculation of three different array configurations. Curve C10 shows the result for an array having a total of 10 reflector rows, curve C12 shows the results for an array having 12 reflector rows, and curve C14 shows the results for an array having 14 reflector rows. For each tilt angle, the optimal distribution of reflector rows was determined. At 15°, for example, the C10 array had 3 equatorial rows, the C12 array had 4 equatorial rows, and the C14 array had 5 equatorial rows. At 20°, the C10 array had 3 equatorial rows, the C12 array had 4 equatorial rows, and the C14 array had 4 equatorial rows. In the calculation, all reflector rows are approximately 2.3 meters wide, the absorber has a width of about 0.60 meters and is located about 15 meters above the reflectors, and the same rows in the arrays of C10, C12, and C14 have the same positions with respect to the receiver. The spacings between polar rows increase with distance from the receiver from about 2.7 meters for the spacing between mirror center lines in the first two rows to about 5.2 meters between the ninth and tenth rows from the receiver. The spacings between mirror center lines in the equatorial rows have a constant value of about 2.6 meters.

As noted above, the optimal distribution of reflector rows between equatorial and polar reflector fields may vary with latitude and other factors. Hence, the tilted receiver examples just described are intended to be illustrative rather than limiting.

Receivers

The receivers 5 and receiver structures 5a and 5b described in this section may, in some variations, be suitable for use in the east-west LFR solar arrays disclosed herein, in east-west and/or north-south LFR solar arrays known to one of ordinary skill in the art, and/or in east-west or north-south LFR solar arrays later developed.

Figure 8B:
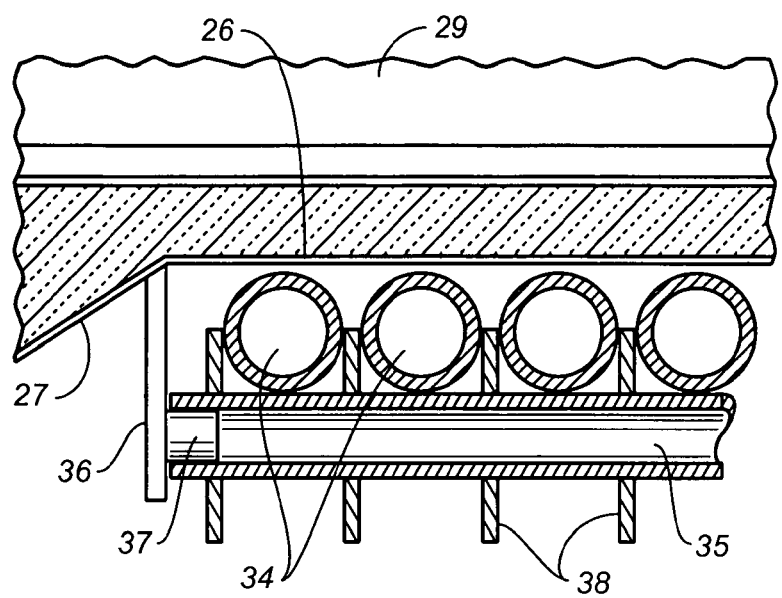

Referring to FIGS. 6, 8A and 8B, in some variations a receiver structure 5a comprises an inverted trough 24 which might typically be formed from stainless steel sheeting and which, as best seen in FIG. 8, has a longitudinally extending channel portion 26 and flared side walls 27 that, at their margins, define the transverse width of an aperture of the inverted trough through which solar radiation incident from the reflectors may enter the trough. In the illustrated variation, the trough 24 is supported and provided with structural integrity by side rails 28 and transverse bridging members 29, and the trough is surmounted by a corrugated steel roof 30 that is carried by arched structural members 31.

In the illustrated variation, the void between the trough 24 and the roof 30 is filled with a thermal insulating material 32, typically a glass wool material, and desirably with an insulating material that is clad with a reflective metal layer. The function of the insulating material and the reflective metal layer is to inhibit upward conduction and radiation of heat from within the trough. Other forms and configurations of insulation may be used, however.

A longitudinally extending window 25 is provided to interconnect the side walls 27 of the trough. The window is formed from a sheet of material that is substantially transparent to solar radiation and it functions to define a closed (heat retaining) longitudinally extending cavity 33 within the trough. Window 25 may be formed from glass, for example. Although window 25 is depicted in FIG. 6 and FIG. 8 as having a convex curved shape, this is not necessary and in other variations window 25 may be flat, for example.

In the receiver structure as illustrated in FIGS. 6, 8, and 9, longitudinally extending (e.g., stainless steel or carbon steel) absorber tubes 34 are provided for carrying working or heat exchange fluid (typically water or, following heat absorption, water-steam or steam). The actual number of absorber tubes may be varied to suit specific system requirements, provided that each absorber tube has a diameter that is small relative to the dimension of the trough aperture between the side walls 28 of the trough, and the receiver structure might typically have between about six and about thirty absorber tubes 34 supported side-by side within the trough.

The actual ratio of the absorber tube diameter to the trough aperture dimension may be varied to meet system requirements but, in order to indicate an order of magnitude of the ratio, it might typically be within the range of about 0.01:1.00 to about 0.1:1.00. Each absorber tube 34 might have an outside diameter of about 25 millimeters to about 160 millimeters, for example. In one variation, the absorber tubes have outside diameters of about 33 mm. In another variation the absorber tubes have outside diameters of about 60 mm.

With the above described arrangement the plurality of absorber tubes 34 may effectively simulate a flat plate absorber, as compared with a single-tube collector in a concentrating trough. This provides for increased operating efficiency, in terms of a reduced level of heat emission from the upper, non-illuminated circumferential portion of the absorber tubes. Moreover, by positioning the absorber tubes in the inverted trough in the manner described, the underside portion only of each of the absorber tubes is illuminated with incident radiation, this providing for efficient heat absorption in absorber tubes that carry steam above water.

In the illustrated variation, the absorber tubes 34 are freely supported by a series of parallel support tubes 35 which extend orthogonally between side walls 36 of the channel portion 26 of the inverted trough, and the support tubes 35 may be carried for rotational movement by spigots 37. This arrangement accommodates expansion of the absorber tubes and relative expansion of the individual tubes. Disk-shaped spacers 38 are carried by the support tubes 35 and serve to maintain the absorber tubes 34 in spaced relationship. Other arrangements for supporting the absorber tubes in the inverted trough may also be used.

In some variations, each of the absorber tubes 34 may be coated with a solar absorptive coating. The coating may comprise, for example, a solar spectrally selective surface coating that remains stable under high temperature conditions in ambient air or, for example, a black paint that is stable in air under high-temperature conditions. In some variations, the solar spectrally selective coating is a coating disclosed in U.S. Pat Nos. 6,632,542 or 6,783,653, both of which are incorporated herein by reference in their entirety.

In one variation, receiver structure 5a has a length of about 12 meters and an overall width of about 1.4 meters. In other variations the length may be, for example, about 10 meters to about 20 meters and the width may be, for example, about 1 meter to about 3 meters.

Referring now to FIGS. 9A-9E, another example receiver structure 5b comprises an inverted trough 24 formed, for example, from stainless steel sheeting and having a longitudinal channel portion 26 and side walls 27 similar to those in receiver structure 5a described above. In receiver structure 5b, trough 24 is supported and provided with structural integrity by longitudinal members 60a-60c and arches 62. Longitudinal members 60a-60c and arches 62 may be formed, for example, from tube steel and welded together, for example, to form an approximately semi-cylindrical framework 64. Trough 24 is further supported and provided with structural integrity by transverse bridging members 66 bridging framework 64. A smooth outer shell 68 of, for example, galvanized steel is attached to framework 64 with, for example, glue. Smooth outer shell 68 provides a low wind profile and sheds water and snow and thus may reduce structural (e.g., strength, rigidity) requirements of receiver structure 5b and reduce opportunities for moisture to enter the receiver.

The void between trough 24 and outer shell 68 may be filled with a thermal insulating material 32, which may be the same or similar materials as described above with respect to receiver structure 5a and which provide the functions there described.

A longitudinally extending window 25 is supported by slot 70 and ledge 72 to interconnect the side walls 27 of trough 24 and form a closed, heat retaining cavity 33 within the trough. Window 25 may be formed from glass, for example. Slot 70 and ledge 72 define the transverse width of the aperture through which solar radiation incident from the reflectors of an LFR array may enter trough 24.

Dust that enters cavity 33 with unfiltered inflowing air might settle on window 25 and reduce its transparency to solar radiation. To reduce this risk, in some variations a gasket material, such as a fiber glass rope, for example is placed between slot 70 and window 25 and between ledge 72 and window 25 to improve the window seal and thereby reduce influx of air and dust into the trough around edges of the window. Alternatively or in addition, an optional laminar flow air tube 74 may provide a laminar flow of air across the inside of window 25 to keep it free of dust without creating significant convective air currents in cavity 33 that might increase loss of heat from cavity 33. Also, vents may be provided in outer shell 66 or in end caps (not shown) of receiver structure 5b to provide a relatively low resistance air flow path from outside of receiver structure 5b to cavity 33 through a material (e.g., insulating material 32) that filters dust from air flowing into cavity 33. Such a low resistance path may suppress flow of unfiltered air through other openings into cavity 33.

Figure 9D:
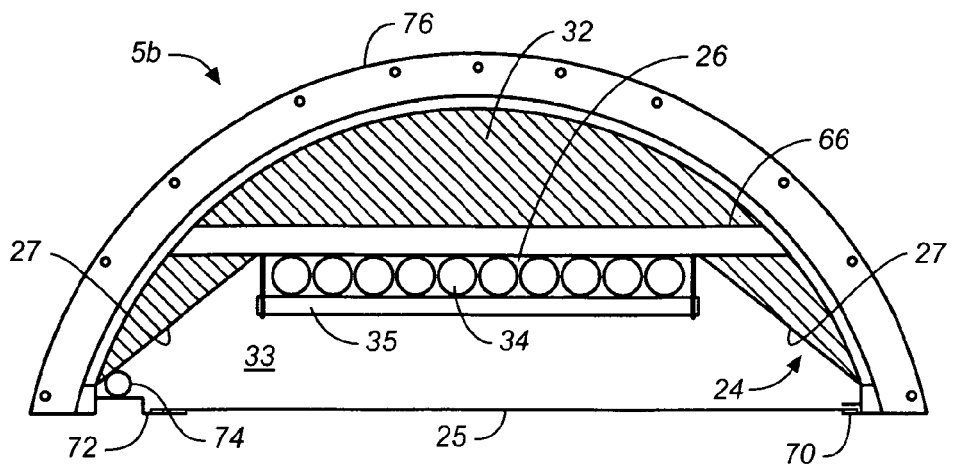
Figure 9E:
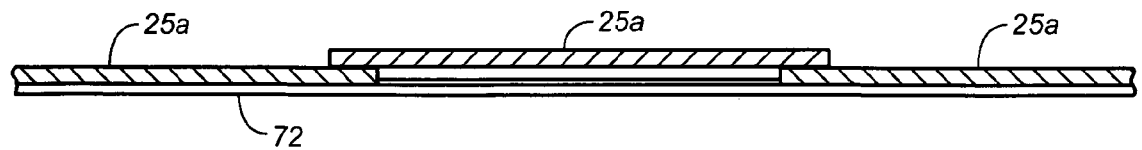

Referring now particularly to FIGS. 9C and 9E, window 25 may comprise a plurality of transparent (e.g., glass) panes 25a positioned in an overlapping manner the length of receiver structure 5b. This arrangement provides a relatively effective seal to influx of air while also providing for thermal expansion of the panes. Overlapping panes 25a may be clamped together at their overlapping portions by clamps (not shown) applied at their outer edges, for example. Alternatively or in addition, window 25 may comprise a plurality of plates that are positioned in an overlapping manner in the transverse direction (i.e., perpendicular to the long axis of the receiver).

Similarly to receiver structure 5a, longitudinally extending (e.g., stainless steel or carbon steel) absorber tubes 34 are provided for carrying a working or heat exchange fluid to be heated by absorbed solar radiation. Absorber tubes 34 may be freely supported in trough 24 by a rolling support tube 35 to accommodate expansion of the absorber tubes during use. Other arrangements for supporting the absorber tubes may also be used. The diameter of the absorber tubes and the ratio of their diameter to the trough aperture may be, for example, as described above with respect receiver structure 5a. Absorber tubes 34 may be coated with solar spectrally selective coatings as described above, for example.

Two or more receiver structures 5b may be aligned and coupled end to end using, for example, flanges 76 to form an extended receiver structure 5 which is then utilized as described above. Gaskets may be provided between the joined receiver structures 5b to reduce influx of air and associated dust at the joint. In some variations, receiver structures 5b (or 5a) are joined into groups of (e.g., 3) receiver structures, and the groups are then joined to each other to form an extended receiver 5 using flexible couplings between absorber tubes in adjacent groups. Such an arrangement may accommodate thermal expansion of the absorber tubes during use.

Referring again to FIG. 9D as well as to FIG. 9F, the aperture of trough 24 is defined by slot 70 and ledge 72 as noted above. In the illustrated variation, the aperture so defined is located off center with respect to the trough in the direction of the polar reflector field and thereby accommodates an LFR array configuration in which the polar reflector field extends further from the receiver than does the equatorial reflector field. In such variations, the receiver and the reflector fields are typically arranged so that a ray reflected by the outer edge of the equatorial reflector row $12E_N$ farthest from the receiver is incident at the largest angle $\alpha_E$ by which it may be incident on the absorber tube nearest to reflector row $12E_N$, and so that a ray reflected by the outer edge of the polar reflector row $12P_M$ farthest from the receiver is incident at the largest angle $\alpha_P$ by which it may be incident on the absorber tube nearest to reflector row $12P_M$.

The asymmetric aperture illustrated in FIGS. 9D and 9F may also provide the advantage of allowing window 25 (e.g., panes 25a) to be loaded into receiver structure 5b by inserting window 25 from the polar side through the aperture.

Referring now to FIG. 10, it may be advantageous to provide spaces (e.g., spaces $A_1$-$A_3$) between absorber tubes 34 in a receiver structure (e.g., receiver structure 5a, 5b) to accommodate thermal expansion and movement of the absorber tubes. Such spaces may allow solar radiation reflected from an LFR array to the absorber tubes to pass between the absorber tubes and hence reduce solar radiation collection efficiency, however. In some variations, the absorber tubes are spaced apart without reducing collection efficiency by setting the spaces between absorber tubes so that solar rays reflected from the closest edge of the reflector row closest to the receiver (e.g., from the inner edge of mirror 12P1) are tangent to adjacent absorber tubes. If the closest reflector row on each side of the receiver is positioned the same distance from the receiver, this method will result in spaces between absorber tubes that vary, with spaces between outer absorber tubes smaller than those between inner absorber tubes. The spacing of the absorber tubes may be simplified by using a uniform spacing equal to the smallest such space determined by this method for all pairs of absorber tubes.

Referring again to FIGS. 8A and 9D, for example, in some variations window 25 of receiver structure 5a or 5b is coated with an anti-reflection coating to reduce losses due to reflection of incident solar radiation by the window. Anti-reflection coatings are generally selected to optimize transmission of light incident at angles around a particular angle of incidence. In some variations, the angle of incidence at which the anti-reflective coating on window 25 is optimized is selected to maximize the annualized solar energy collector efficiency of the LFR array of which the receiver structure is a part. Such selection may be done using, for example, a ray tracing model of the LFR array.

Figure 11A:
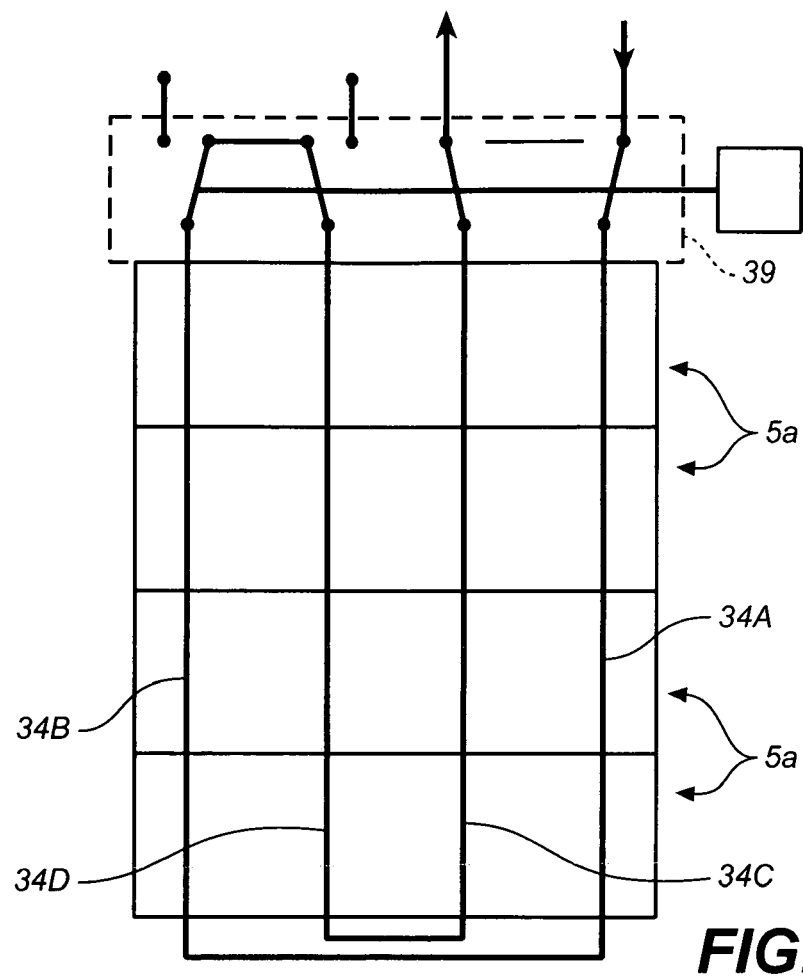
FIGS. 11A-11E show example fluid flow arrangements through a receiver.

In some variations fluid flow through absorber tubes 34 in reflector structure 5a or 5b may be in parallel unidirectional streams. Other flow arrangements may also be used, however. FIG. 11A of the drawings shows diagrammatically one example flow control arrangement for controlling flow of heat exchange fluid into and through four in-line receiver structures 15a of a receiver. As illustrated, each of the fluid lines 34A, B, C and D is representative of four of the absorber tubes 34 as shown in the previous figures.

Under the controlled condition illustrated in FIG. 11A, in-flowing heat exchange fluid is first directed along forward line 34A, along return line 34B, along forward line 34C and finally along and from return line 34D. This results in fluid at a lower temperature being directed through tubes that are located along the margins of the inverted trough and a consequential emission reduction when radiation is concentrated over the central region of the inverted trough. A control device 39 may be provided to enable selective control over the channelling of the heat exchange fluid in some variations.

Figure 11B:
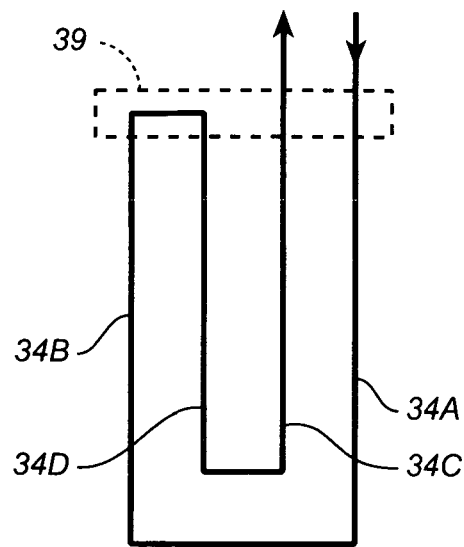
Figure 11C:
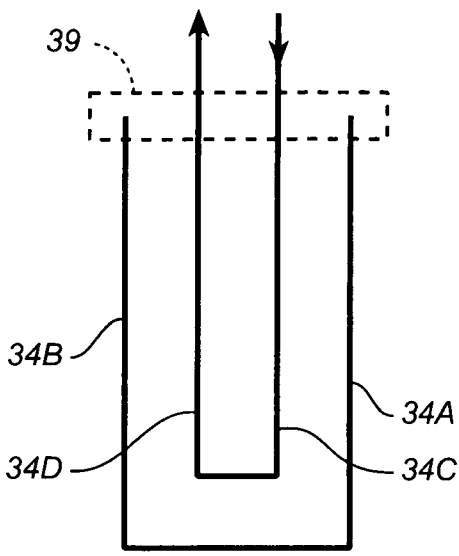
Figure 11D:
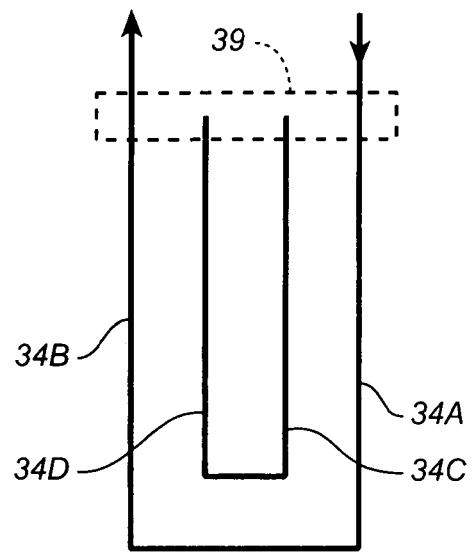

Alternative fluid flow conditions may be established to meet load demands and/or prevailing ambient conditions, and provision may effectively be made for a variable aperture receiver structure by closing selected ones of the absorber tubes. Thus, variation of the effective absorption aperture of each receiver structure and, hence, of a complete receiver may be achieved by controlling the channelling of the heat exchange fluid in the alternative manners shown in FIGS. 11B to 11D.

Figure 11E:
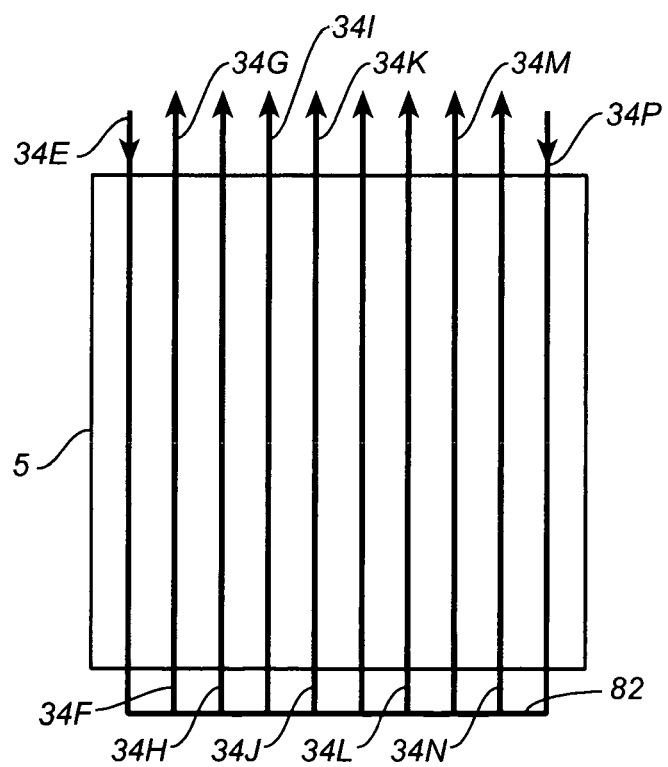

FIG. 11E shows an example fluid flow arrangement through a receiver 5 in which 10 parallel absorber tubes 34 are in fluidic communication at one end of the receiver through a header 82. In this example, cold heat exchange or working fluid flows into the receiver through outer absorber tubes 34E and 34P to header 82, and is then distributed by header 82 between inner absorber tubes 34G-34N along which it flows in a return path back down receiver 5 to exit at a higher temperature. As in FIG. 11A, this configuration can reduce thermal loss due to radiation from the absorber tubes. In addition, this down-and-back configuration allows thermal expansion of the absorber tubes to be accommodated at the header end by, for example, allowing the header to move with the absorber tubes as they change in length with changes in temperature.

Reflectors

The reflectors 12a and 12b described in this section may, in some variations, be suitable for use in the east-west LFR solar arrays disclosed herein, in east-west and /or north-south LFR solar arrays known to one of ordinary skill in the art, and/or in east-west or north-south solar arrays later developed.

Figure 12:
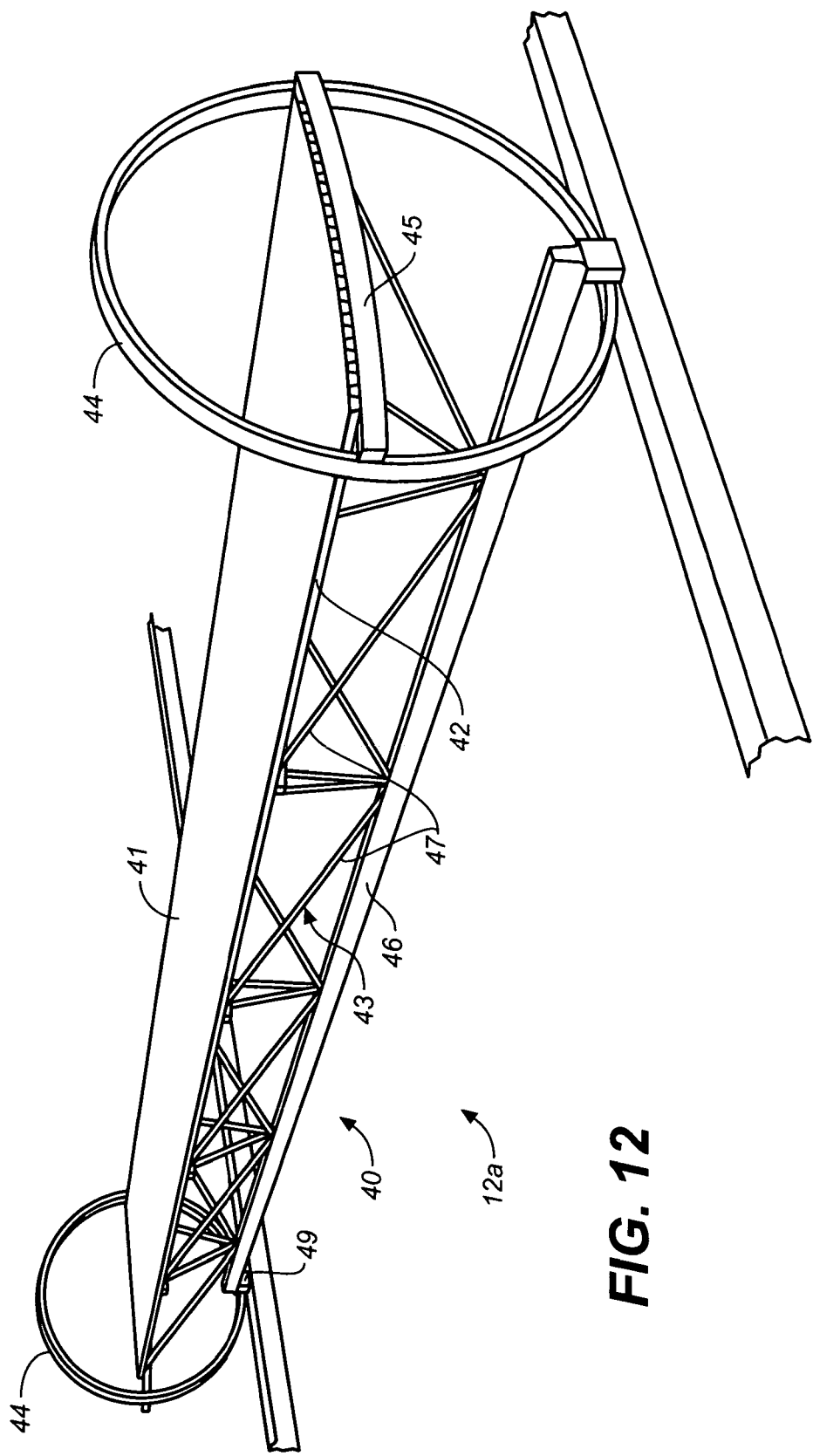
FIG. 12 shows a perspective view of a reflector according to one variation.

Referring to FIG. 12, in some variations a reflector 12a comprises a carrier structure 40 to which a reflector element 41 is mounted. The carrier structure itself comprises an elongated panel-like platform 42 which is supported by a skeletal frame structure 43. The frame structure includes two hoop-like end members 44.

The members 44 are cantered on and extend about an axis of rotation that is approximately coincident with a central, longitudinally-extending axis of the reflector element 41. The axis of rotation does not need to be exactly coincident with the longitudinal axis of the reflector element but the two axes desirably are at least adjacent one another.

In terms of overall dimensions of the reflector, the platform 42 is, for example, about 10 to about 20 meters long and the end members 14 are approximately two meters in diameter. In some variations the platform 42 is about 12 meters long. In some other variations the platform 42 is about 16 meters long.

The platform 42 comprises a corrugated metal panel and the reflector element 41 is supported upon the crests of the corrugations. The corrugations extend parallel to the direction of the longitudinal axis of the reflector element 41, and the platform 42 is carried by, for example, six transverse frame members 45 of the skeletal frame structure 43. End ones of the transverse frame members 45 effectively comprise diametral members of the hoop-like end members 44.

The transverse frame members 45 comprise rectangular hollow section steel members and each of them is formed with a curve so that, when the platform 42 is secured to the frame members 45, the platform is caused to curve concavely (as viewed from above in FIG. 12) in a direction orthogonal to the longitudinal axis of the reflector element 41. The same curvature is imparted to the reflector element 41 when it is secured to the platform 42. The radius of curvature of the transverse frame members 45 is, for example, about twenty to about fifty meters.

The skeletal frame 43 of the carrier structure 40 also comprises a rectangular hollow section steel spine member 46 which interconnects the end members 44, and a space frame which is fabricated from tubular steel struts 47 connects opposite end regions of each of the transverse frame members 45 to the spine member 46. This skeletal frame arrangement, together with the corrugated structure of the platform 42 provides the composite carrier structure 41 with a high degree of torsional stiffness.

Figure 13:
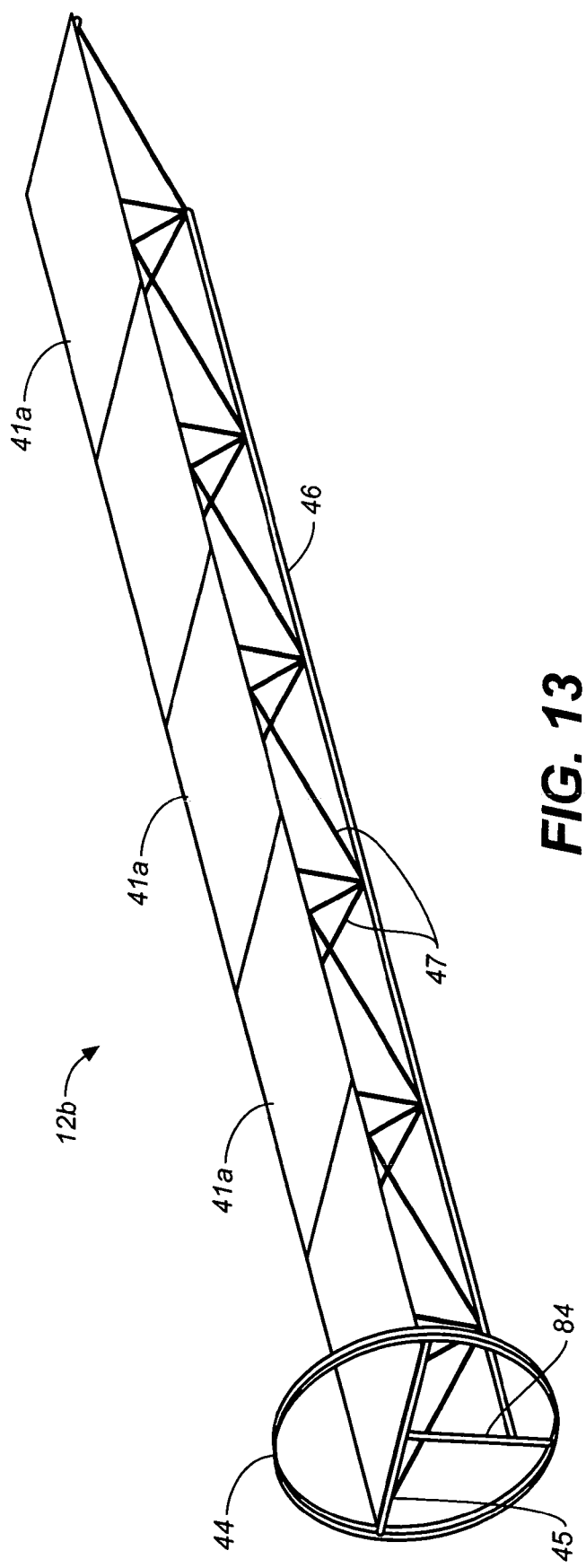
FIG. 13 shows a perspective view of a reflector according to another variation.

Referring now to FIG. 13, in another variation a reflector 12b has a structure substantially similar to that of reflector 12a, but includes in addition a radial spoke 84 located within a hoop-like end member 44. Spoke 84 is attached to and runs between the hoop-like end member and an end one of the transverse frame members 45, and is also attached to one end of spine 46.

Figure 14:
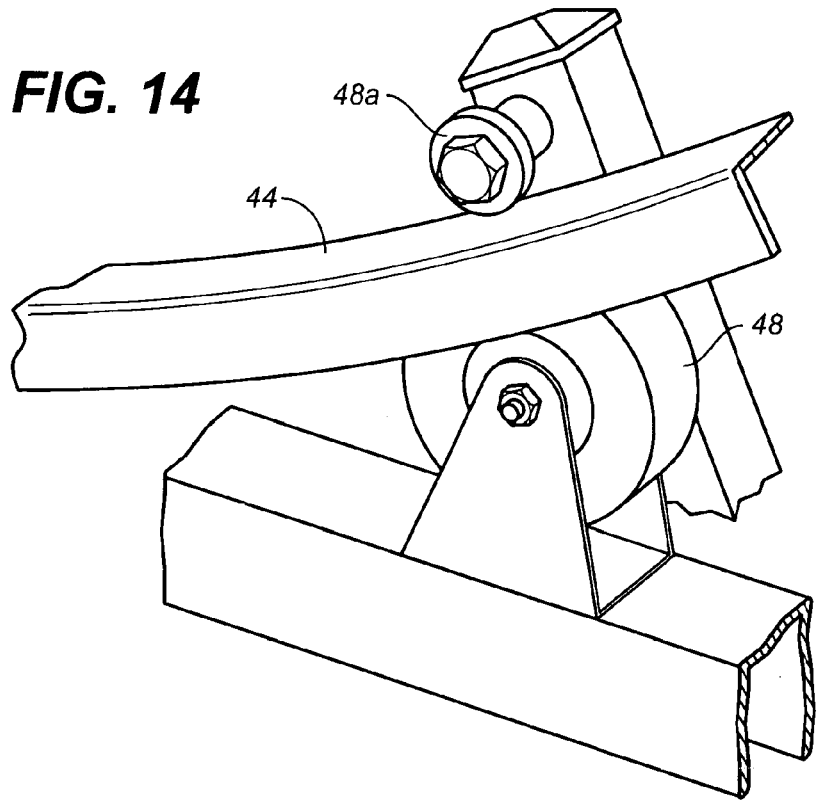
FIG. 14 shows on an enlarged scale a portion of a mounting arrangement for a reflector.

The hoop-like end members 44 of reflectors 12a, 12b are formed from channel section steel, for example, such that each end member is provided with a U-shaped circumferential portion and, as shown in FIG. 14, each of the members 44 is supported for rotation on a mounting arrangement that comprises two spaced-apart rollers 48. The rollers 48 are positioned to track within the channel section of the respective end members 44, and the rollers 48 provide for turning (i.e., rotation) of the carrier structure 40 about the axis of rotation that is approximately coincident with the longitudinal axis of the reflector element 41.

As also shown in FIG. 8, a hold-down roller 48a is located adjacent the support rollers 48 and is positioned within the associated end member 44 to prevent lifting of the reflector under adverse weather conditions.

Figure 15:
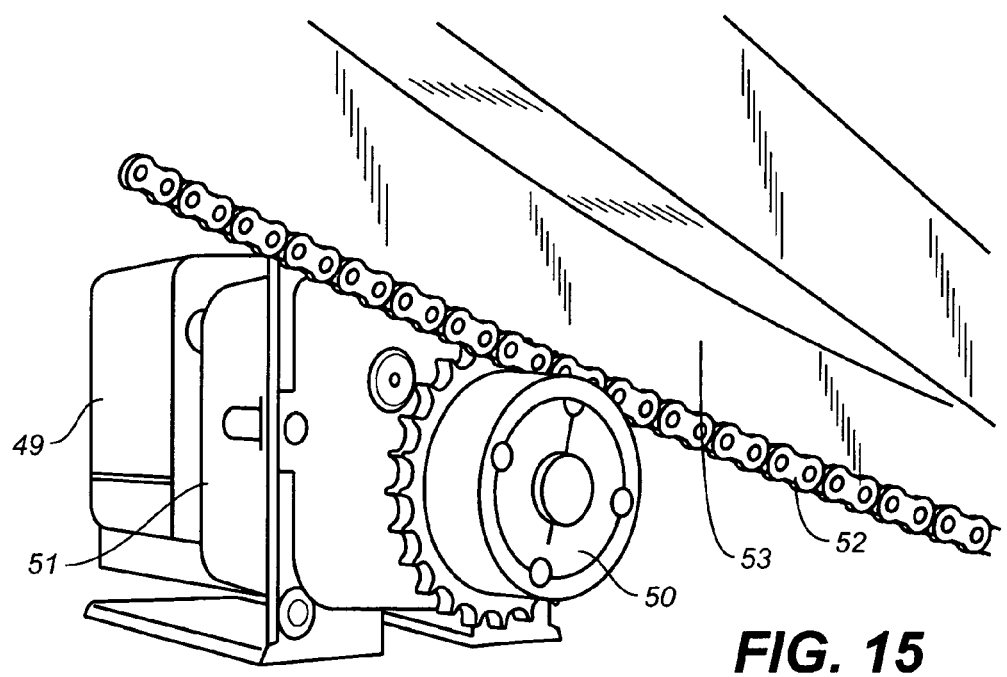
FIG. 15 shows on an enlarged scale a portion of a reflector and a drive system for the reflector according to one variation.

A drive system, one variation of which is shown in FIG. 15, is provided for imparting drive to the carrier structure 40 and, hence, to the reflector element 41. The drive system comprises, for example, an electric motor 49 having an output shaft coupled to a sprocket 50 by way of reduction gearing 51. The sprocket 50 meshes with a link chain 52 through which drive is directed to the carrier structure 40. The link chain 52 extends around and is fixed to the periphery of the outer wall 53 of the channel-section of one of the end member 44. That is, the link chain 52 affixed to the end member effectively forms a type of gear wheel with which the sprocket 50 engages.

In another variation, a drive chain has its ends fixed to end member 44 at locations adjacent to each other within the channel section of the end member. The remaining portion of the chain forms a loop running around a portion of end member 44 through the channel structure and thence to and around a sprocket such as sprocket 50 shown in FIG. 15. The sprocket is driven bidirectionally by an electric motor through suitable reduction gearing. This arrangement allows for approximately 270° bidirectional rotation of the reflector, and consequently facilitates solar tracking of reflectors in an east-west LFR array.

Referring again to FIGS. 12 and 13, the reflector element 41 is formed, for example, by butting together a plurality of glass mirrors 41a. A silicone sealant may be employed to seal gaps around and between the mirrors and to minimize the possibility for atmospheric damage to the rear silvered faces of the mirrors. The mirrors may be secured to the crests of the platform 12 by a urethane adhesive, for example. In some variations, the mirrors have a thickness of 0.003 m and, thus, they may readily be curved in situ to match the curvature of the supporting platform 42.

Depending upon requirements, two or more of the above described reflectors may be positioned linearly in a row and be connected one to another by way of hoop-like end members 44. In such an arrangement a single drive system may be employed for imparting drive to multiple reflectors.

This disclosure is illustrative and not limiting. Further modifications will be apparent to one skilled in the art in light of this disclosure and are intended to fall within the scope of the appended claims. All publications and patent applications cited in the specification are incorporated herein by reference in their entirely as if each individual publication or patent application were specifically and individually put forth herein.

We claim:

1. A solar energy collector system comprising:
an elevated linear receiver extending generally in an east-west direction;
a polar reflector field located on the polar side of the receiver; and
an equatorial reflector field located on the equatorial side of the receiver;
wherein each reflector field comprises reflectors positioned in one or more parallel side-by-side rows which extend generally in the east-west direction, the reflectors in each field are arranged to reflect incident solar radiation to the receiver during diurnal east-west motion of the sun and pivotally driven to maintain reflection of the incident solar radiation to the receiver during cyclic diurnal north-south motion of the sun, and the polar reflector field comprises more reflector rows than the equatorial reflector field.

2. The solar energy collector system of claim 1, wherein the receiver comprises a photovoltaic device which absorbs solar radiation reflected to it by the reflectors and converts the solar radiation to electricity.

3. The solar energy collector system of claim 1, wherein the receiver comprises an absorber that absorbs solar radiation reflected to it by the reflectors to heat a working or heat exchange fluid.

4. The solar energy collector system of claim 1, wherein reflector rows on opposite sides of the receiver are spaced asymmetrically.

5. The solar energy collector system of claim 4, wherein the receiver comprises an absorber that absorbs solar radiation reflected to it by the reflectors to heat a working or heat exchange fluid.

6. The solar energy collector system of claim 5, wherein the receiver is tilted in the direction of the polar reflector field.

7. The solar energy collector system of claim 5, wherein one or more outer rows of the equatorial reflector field have focal lengths greater than their respective distances to a solar radiation absorber in the receiver.

8. The solar energy collector system of claim 5, wherein the receiver comprises a window through which solar radiation reflected by the reflectors is directed to the absorber and the window comprises an anti-reflection coating having a maximum transmission of solar radiation at an angle of incidence that maximizes an annualized solar radiation collection efficiency of the solar energy collector system.

* * * * *